United States Patent
Baker

(10) Patent No.: US 8,675,413 B2
(45) Date of Patent: Mar. 18, 2014

(54) REFERENCE CURRENT SOURCES

(75) Inventor: R. Jacob Baker, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 2 days.

(21) Appl. No.: 13/306,848

(22) Filed: Nov. 29, 2011

(65) Prior Publication Data

US 2012/0068758 A1 Mar. 22, 2012

Related U.S. Application Data

(62) Division of application No. 11/818,982, filed on Jun. 15, 2007, now Pat. No. 8,068,367.

(51) Int. Cl.
*G11C 11/34* (2006.01)
*G11C 7/02* (2006.01)
*G11C 7/04* (2006.01)

(52) U.S. Cl.
USPC .............. 365/185.2; 365/185.21; 365/210.1; 365/211

(58) Field of Classification Search
USPC ............. 365/185.03, 185.18, 185.2, 185.21, 365/185.26, 185.33, 211; 326/35; 341/143
See application file for complete search history.

(56) References Cited

U.S. PATENT DOCUMENTS

| | | | |
|---|---|---|---|
| 5,600,319 A | 2/1997 | Ginetti | |
| 5,614,856 A | 3/1997 | Wilson et al. | |
| 5,760,723 A * | 6/1998 | McGrath et al. | 341/143 |
| 5,953,276 A | 9/1999 | Baker | |
| 6,016,272 A * | 1/2000 | Gerna et al. | 365/185.21 |
| 6,044,019 A | 3/2000 | Cernea et al. | |
| 6,188,340 B1 | 2/2001 | Matsumoto et al. | |
| 6,282,120 B1 | 8/2001 | Cernea et al. | |
| 6,320,790 B1 * | 11/2001 | Micheloni | 365/185.2 |
| 6,373,767 B1 * | 4/2002 | Patti | 365/185.2 |
| 6,430,585 B1 * | 8/2002 | Beiu | 326/35 |
| 6,490,200 B2 | 12/2002 | Cernea et al. | |
| 6,504,750 B1 | 1/2003 | Baker | |
| 6,535,428 B2 * | 3/2003 | Pasotti et al. | 365/185.21 |
| 6,567,297 B2 | 5/2003 | Baker | |
| 6,661,708 B2 | 12/2003 | Cernea et al. | |
| 6,664,708 B2 | 12/2003 | Shlimak et al. | |
| 6,665,013 B1 | 12/2003 | Fossum et al. | |
| 6,683,905 B1 * | 1/2004 | King et al. | 341/143 |
| 6,731,531 B1 * | 5/2004 | Forbes et al. | 365/185.26 |
| 6,741,502 B1 | 5/2004 | Cernea | |
| 6,781,906 B2 | 8/2004 | Perner et al. | |
| 6,785,156 B2 | 8/2004 | Baker | |
| 6,795,359 B1 | 9/2004 | Baker | |
| 6,798,705 B2 | 9/2004 | Baker | |
| 6,801,454 B2 * | 10/2004 | Wang et al. | 365/185.18 |

(Continued)

OTHER PUBLICATIONS

Rane Corporation, RaneNote 137, "Digital Charma of Audio A/D Converters," 1997, 12 pgs.

(Continued)

*Primary Examiner* — Trong Phan
(74) *Attorney, Agent, or Firm* — Fletcher Yoder, PC

(57) ABSTRACT

Systems, methods, and devices are disclosed, including an electronic device that includes a first data location, a quantizing circuit, and a reference current source, all coupled to an electrical conductor. The reference current source may include a current mirror with a side coupled to the electrical conductor and a second data location coupled to another side of the current mirror.

23 Claims, 18 Drawing Sheets

(56) References Cited

U.S. PATENT DOCUMENTS

| | | | |
|---|---|---|---|
| 6,807,403 B2 | 10/2004 | Tanaka | |
| 6,813,208 B2 | 11/2004 | Baker | |
| 6,822,892 B2 | 11/2004 | Baker | |
| 6,826,102 B2 | 11/2004 | Baker | |
| 6,829,188 B2 | 12/2004 | Baker | |
| 6,847,234 B2 | 1/2005 | Choi | |
| 6,850,441 B2 | 2/2005 | Mokhlesi et al. | |
| 6,856,564 B2 | 2/2005 | Baker | |
| 6,870,784 B2 | 3/2005 | Baker | |
| 6,901,020 B2 | 5/2005 | Baker | |
| 6,906,956 B2* | 6/2005 | Marotta et al. | 365/185.18 |
| 6,914,838 B2 | 7/2005 | Baker | |
| 6,930,942 B2 | 8/2005 | Baker | |
| 6,954,390 B2 | 10/2005 | Baker | |
| 6,954,391 B2 | 10/2005 | Baker | |
| 6,977,601 B1 | 12/2005 | Fletcher et al. | |
| 6,985,375 B2 | 1/2006 | Baker | |
| 7,002,833 B2 | 2/2006 | Hush et al. | |
| 7,009,901 B2 | 3/2006 | Baker | |
| 7,095,667 B2 | 8/2006 | Baker | |
| 7,102,932 B2 | 9/2006 | Baker | |
| 7,133,307 B2 | 11/2006 | Baker | |
| 7,245,529 B2* | 7/2007 | Chen et al. | 365/211 |
| 7,324,380 B2* | 1/2008 | Negut et al. | 365/185.2 |
| 7,352,637 B2* | 4/2008 | Honda | 365/185.2 |
| 7,366,021 B2 | 4/2008 | Taylor et al. | |
| 7,800,968 B2* | 9/2010 | Kern | 365/185.2 |
| 2002/0101758 A1 | 8/2002 | Baker | |
| 2002/0194557 A1 | 12/2002 | Park | |
| 2003/0039162 A1 | 2/2003 | Baker | |
| 2003/0043616 A1 | 3/2003 | Baker | |
| 2003/0067797 A1 | 4/2003 | Baker | |
| 2003/0198078 A1 | 10/2003 | Baker | |
| 2003/0214868 A1 | 11/2003 | Baker | |
| 2004/0008555 A1 | 1/2004 | Baker | |
| 2004/0032760 A1 | 2/2004 | Baker | |
| 2004/0062100 A1 | 4/2004 | Baker | |
| 2004/0076052 A1 | 4/2004 | Baker | |
| 2004/0095839 A1 | 5/2004 | Baker | |
| 2004/0190327 A1 | 9/2004 | Baker | |
| 2004/0190334 A1 | 9/2004 | Baker | |
| 2004/0199710 A1 | 10/2004 | Baker | |
| 2004/0240294 A1 | 12/2004 | Baker | |
| 2005/0002249 A1 | 1/2005 | Baker | |
| 2005/0007803 A1 | 1/2005 | Baker | |
| 2005/0007850 A1 | 1/2005 | Baker | |
| 2005/0013184 A1 | 1/2005 | Baker | |
| 2005/0018477 A1 | 1/2005 | Baker | |
| 2005/0018512 A1 | 1/2005 | Baker | |
| 2005/0041128 A1 | 2/2005 | Baker | |
| 2005/0088892 A1 | 4/2005 | Baker | |
| 2005/0088893 A1 | 4/2005 | Baker | |
| 2005/0201145 A1 | 9/2005 | Baker | |
| 2006/0013040 A1 | 1/2006 | Baker | |
| 2006/0062062 A1 | 3/2006 | Baker | |
| 2006/0227641 A1 | 10/2006 | Baker | |
| 2006/0250853 A1* | 11/2006 | Taylor et al. | |

OTHER PUBLICATIONS

Baker, R.J., (2001-2006) *Sensing Circuits for Resistive Memory*, presented at various universities and companies.

Baker, "*CMOS Mixed Signal Circuit Design*," IEEE Press, A. John Wiley & Sons, Inc.; Copyright 2003, Figures 30.63, 31.82, 32.6, 32.7, 32.24, 32.51, 33.34, 33.47, 33.51, 34.18, 34.24; located at http://cmosedu.com/cmos2/book2.htm.

Dallas Semiconductor, Maxim Application Note 1870, "*Demystifying Sigma-Delta ADCs*," (Jan. 31, 2003), 15 pgs.

Baker, R.J., (2003) *Mixed-Signal Design in the Microelectronics Curriculum*, IEEE University/Government/Industry Microelectronics (UGIM) Symposium, Jun. 30-Jul. 2, 2003.

Baker, R.J. (2004) *Delta-Sigma Modulation for Sensing, IEEE/EDS Workshop on Microelectronics and Electron Devices (WMED)*, Apr. 2004.

Baker, "*CMOS Circuit Design, Layout, and Simulation*," Second Edition, IEEE Press, A. John Wiley & Sons, Inc.; Copyright 2005; Chapters 13, 16, 17, 20, 22-24, 28-29; pp. 375-396, 433-522, 613-656, 711-828, 931-1022.

Hadrick, M. and Baker, R.J., (2005) Sensing in CMOS Imagers using Delta-Sigma Modulation, a general presentation of our work in this area.

Baker, R.J. (2005) *Design of High-Speed CMOS Op-Amps for Sinal Processing, IEEE/EDS Workshop on Microelectronics and Electron Devices (WMED)*, Apr. 2005.

Leslie, M.B., and Baker, R.J., (2006) "*Noise-Shaping Sense Amplifier for MRAM Cross-Point Arrays*," IEEE Journal of Solid State Circuits, vol. 41, No. 3, pp. 699-704.

Duvvada, K., Saxena, V., and Baker, R. J., (2006) *High Speed Digital Input Buffer Circuits*, proceedings of the IEEE/EDS Workshop on Microelectronics and Electron Devices (WMED), pp. 11-12, Apr. 2006.

Saxena, V., Plum, T.J., Jessing, J.R., and Baker, R. J., (2006) *Design and Fabrication of a MEMS Capacitive Chemical Sensor System*, proceedings of the IEEE/EDS Workshop on Microelectronics and Electron Devices (WMED), pp. 17-18, Apr. 2006.

Baker, R.J. and Saxena, V., (2007) *Design of Bandpass Delta Sigma Modulators: Avoiding Common Mistakes*, presented at various universities and companies.

Wikipedia—definition of "Error detection and correction", pulled from website Jun. 1, 2007, 9 pgs.

Wikipedia—definition of "Hamming code", pulled from website Jun. 1, 2007, 8 pgs.

Wikipedia—definition of "Linear feedback shift register (LFSR)," pulled from website Jun. 1, 2007, 4 pgs.

Park, "*Motorola Digital Signal Processors—Principles of Sigma-Delta Modulation for Analog-to-Digital Converters*," (Undated).

* cited by examiner

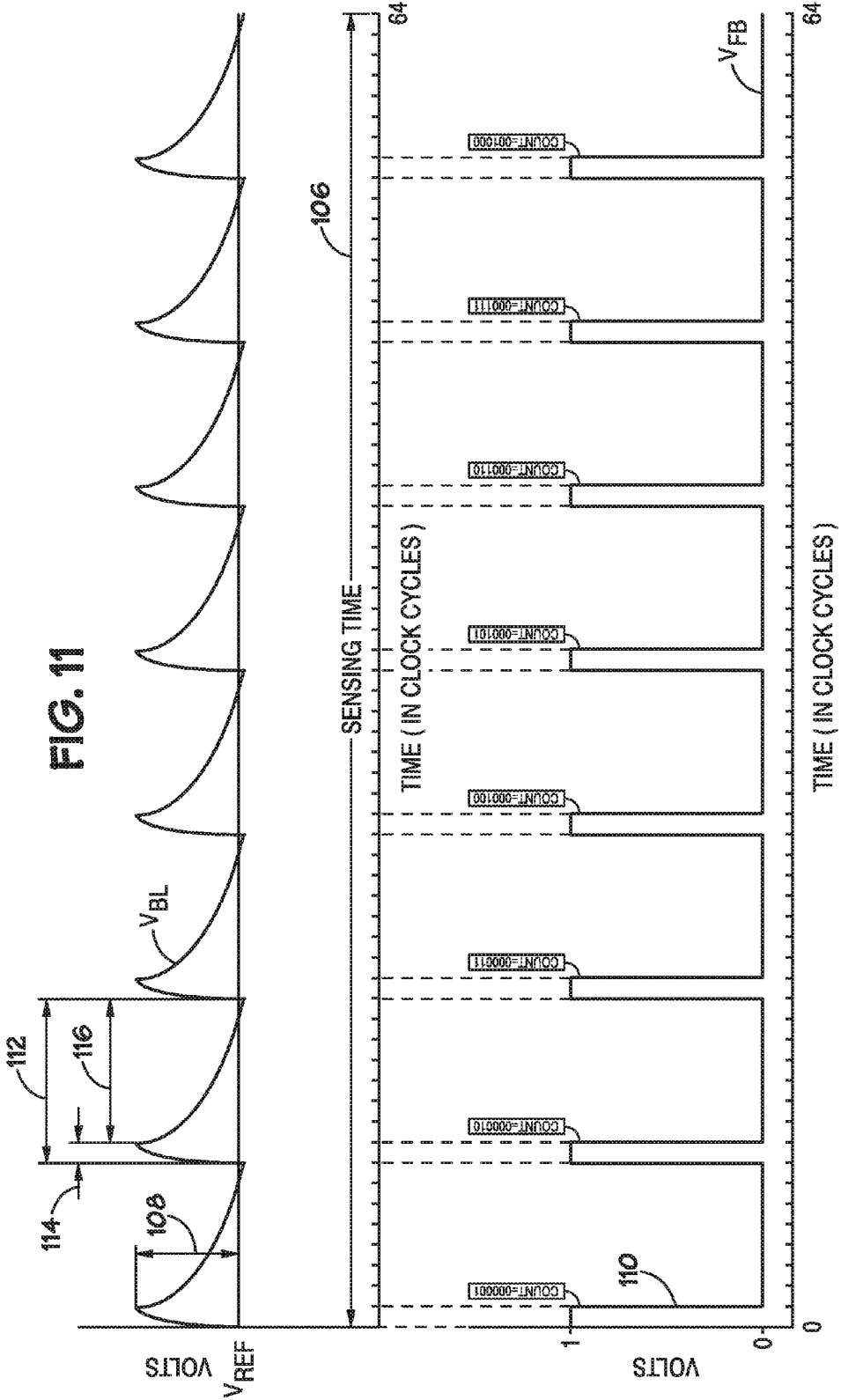

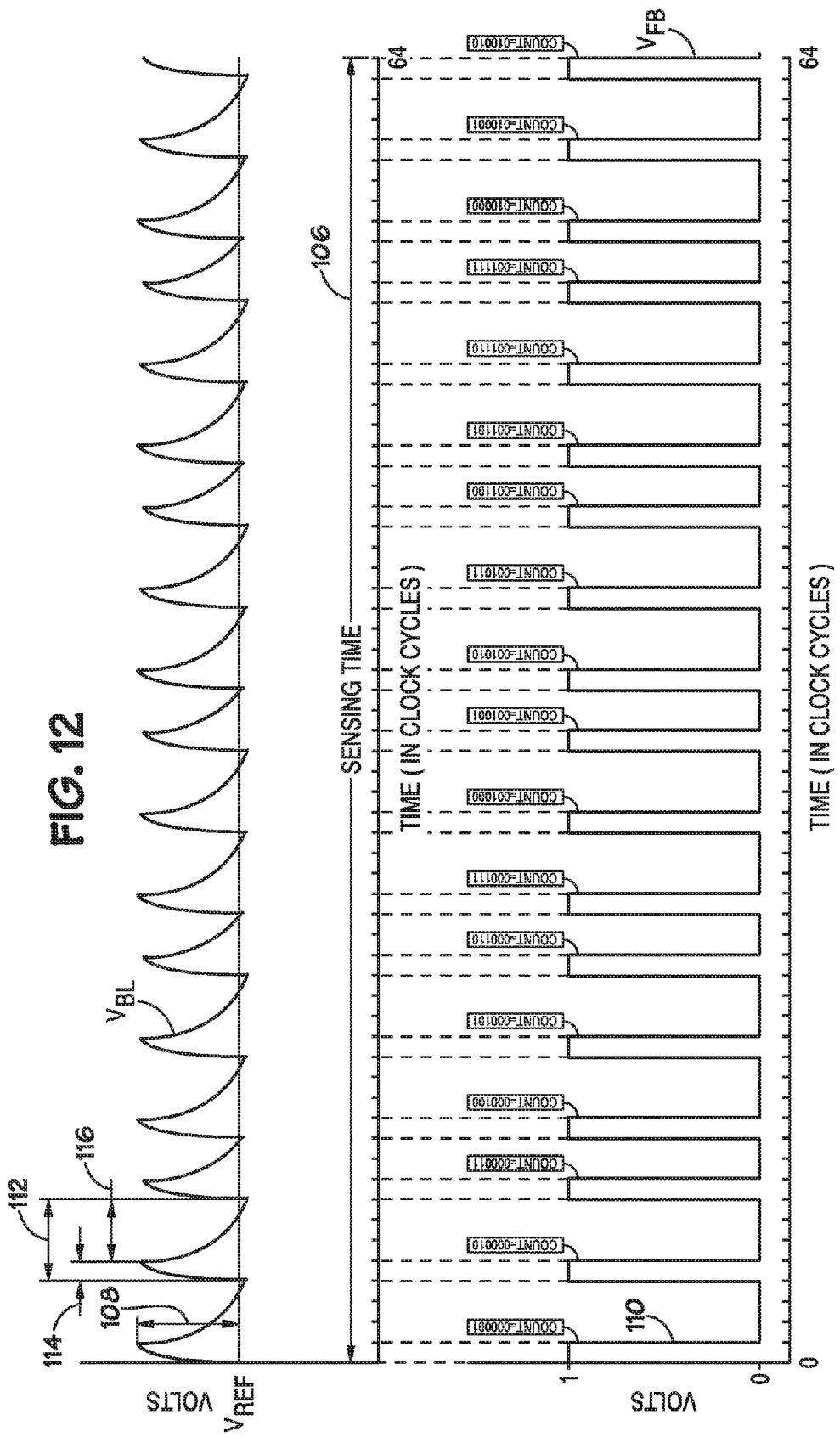

REFERENCE CURRENT SOURCES

CROSS-REFERENCE TO RELATED APPLICATION

This application is a divisional of U.S. patent application Ser. No. 11/818,982, which was filed on Jun. 15, 2007.

BACKGROUND

1. Field of Invention

Embodiments of the present invention relate generally to electronic devices and, more specifically, in some embodiments, to electronic devices having reference current sources that are robust to temperature variations.

2. Description of Related Art

Generally, memory devices include an array of memory elements and associated sense amplifiers. The memory elements store data, and the sense amplifiers read the data from the memory elements. To read data, for example, a current is passed through the memory element, and the current or a resulting voltage is measured by the sense amplifier. Conventionally, the sense amplifier measures the current or voltage by comparing it to a reference current or voltage. Depending on whether the current or voltage is greater than the reference, the sense amplifier outputs a value of one or zero. That is, the sense amplifier quantizes or digitizes the analog signal from the memory element into one of two logic states.

Many types of memory elements are capable of assuming more than just two states. For example, some memory elements are capable of multi-bit (e.g., more than two state) storage. For instance, rather than outputting either a high or low voltage, the memory element may output four or eight different voltage levels, each level corresponding to a different data value. However, conventional sense amplifiers often fail to distinguish accurately between the additional levels because the difference between the levels (e.g., a voltage difference) in a multi-bit memory element is often smaller than the difference between the levels in a single-bit (i.e., two state) memory element. Thus, conventional sense amplifiers often cannot read multi-bit memory elements. This problem may be increased as high performance multi-bit memory elements become increasingly dense, thereby reducing the size of the memory elements and the difference between the levels (e.g., voltage) to be sensed by the sense amplifiers.

A variety of factors may tend to prevent the sense amplifier from discerning small differences in the levels of a multi-bit memory element. For instance, noise in the power supply, ground, and reference voltage may cause an inaccurate reading of the memory element. The noise may have a variety of sources, such as temperature variations, parasitic signals, data dependent effects, and manufacturing process variations. This susceptibility to noise often leads a designer to reduce the number of readable states of the memory element, which tends to reduce memory density and increase the cost of memory.

Conventional sense amplifiers present similar problems in imaging devices. In these devices, an array of light sensors output a current or voltage in response to light impinging upon the sensor. The magnitude of the current or voltage typically depends upon the intensity of the light. Thus, the capacity of the sense amplifier to accurately convert the current or voltage into a digital signal may determine, in part, the fidelity of the captured image. Consequently, noise affecting the sense amplifier may diminish the performance of imaging devices.

BRIEF DESCRIPTION OF DRAWINGS

FIGS. 11-13 illustrate voltages in the quantizing circuit of FIG. 8 when sensing small, medium, and large currents, respectively;

DETAILED DESCRIPTION OF SPECIFIC EMBODIMENTS

Various embodiments of the present invention are described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming but would nevertheless be a routine undertaking of design, fabrication, and manufacture for those of ordinary skill having the benefit of this disclosure.

Some of the subsequently described embodiments may address one or more of the problems with conventional sense amplifiers discussed above. Some embodiments include a quantizing circuit configured to detect small differences in voltages and/or currents. As explained below, the quantizing circuit may sample the measured electrical parameter on multiple occasions and filter, e.g., average or sum, the samples to reduce the impact of noise. As a result, in some embodiments, the quantizing circuit may resolve small differences between voltage or current levels in multi-bit memory elements and/or light sensors, which may allow circuit designers to increase the number of bits stored per memory element and/or the sensitivity of an imaging device.

In the course of measuring the electrical parameter, the quantizing circuit may compare the electrical parameter to a reference signal. In some designs, as discussed above, this reference signal may vary with temperature, which could interfere with accurately sensing the electrical parameter. This problem may be mitigated by some of the embodiments described below. Specifically, FIGS. 16-21 illustrate several examples of references current sources that are robust to temperature variations. As explained below, these reference current sources may reduce a source of noise that could otherwise impede the operation of the quantizing circuits.

Figure 1:
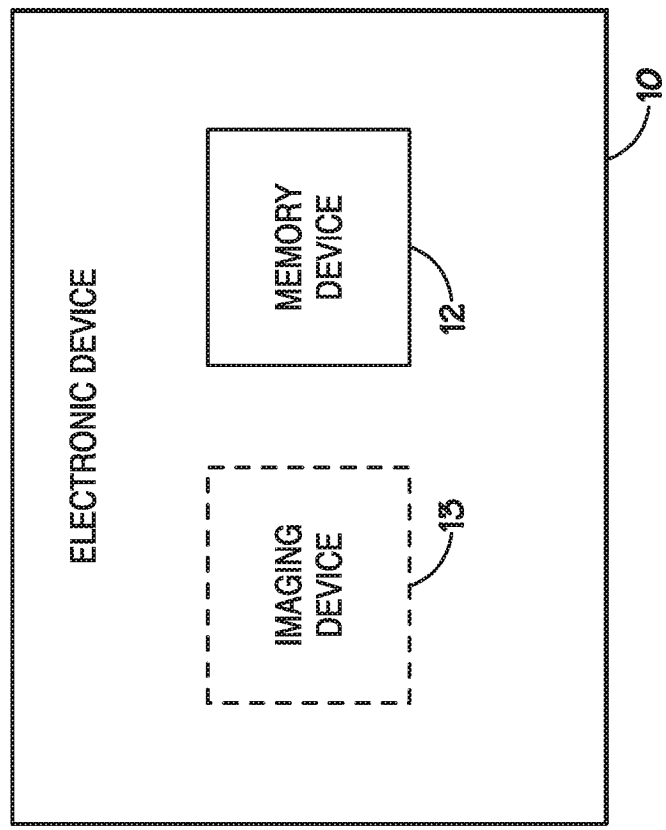
FIG. 1 illustrates an electronic device in accordance with an embodiment of the present invention.

FIG. 1 depicts an electronic device 10 that may be fabricated and configured in accordance with one or more of the present embodiments. The illustrated electronic device 10 includes a memory device 12 that, as explained further below, may include multi-bit memory elements and quantizing circuits. Alternatively, or additionally, the electronic device 10 may include an imaging device 13 having the quantizing circuits.

Myriad devices may embody one or more of the present techniques. For example, the electronic device 10 may be a storage device, a communications device, an entertainment device, an imaging system, or a computer system, such as a personal computer, a server, a mainframe, a tablet computer, a palm-top computer, or a laptop.

Figure 2:
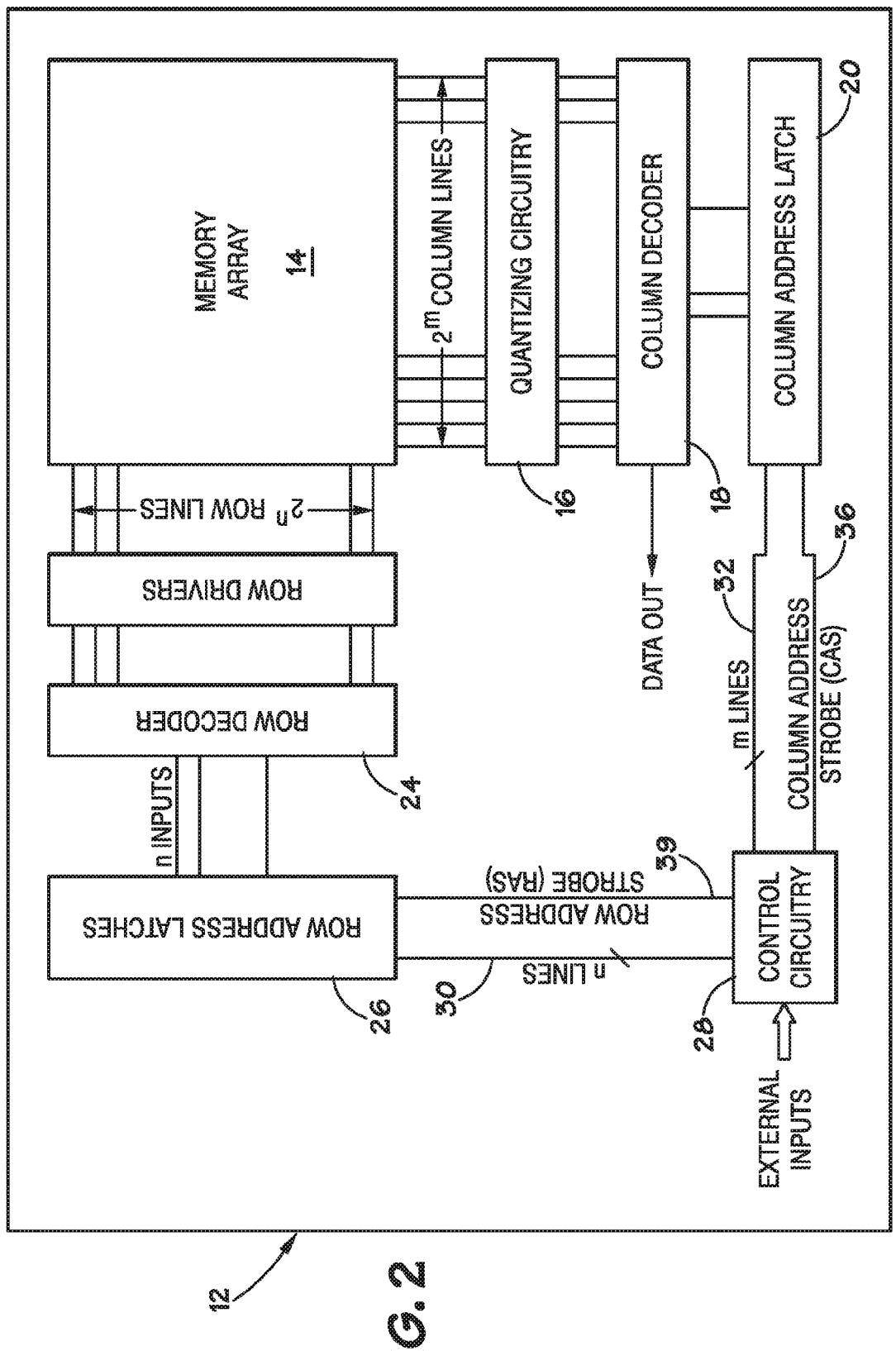
FIG. 2 illustrates a memory device in accordance with an embodiment of the present invention.

FIG. 2 depicts a block diagram of an embodiment of the memory device 12. The illustrated memory device 12 may include a memory array 14, a quantizing circuit 16, a column decoder 18 from which a data out signal may be transmitted and with $2^n$ column lines coupled thereto, a column address latch 20, row drivers 22, a row decoder 24 with $2^m$ row lines coupled thereto, row address latches 26, and control circuitry 28 that may receive external inputs. As described below with reference to FIG. 3, the memory array 14 may include a matrix of memory elements arranged in rows and columns. As will be appreciated, the imaging device 13 (FIG. 1) may include similar features except that in the case of an imaging device 13, the array 14 might comprise an array of imaging elements, such as complementary-metal-oxide semiconductor (CMOS) imaging elements or charge coupled devices (CCDs).

When accessing the memory elements, the control circuitry may receive a command to read from or write to a target memory address. The control circuitry 28 may then convert the target address into a row address and a column address. In the illustrated embodiment, the row address bus 30 for example, including n lines) transmits the row address to the row address latches 26, and a column address bus 32 (for example, including m lines) transmits column address to the column address latches 20. After an appropriate settling time, a row address strobe (RAS) signal 39 (or other controlling clock signal) may be asserted by the control circuitry 28, and the row address latches 26 may latch the transmitted row address. Similarly, the control circuitry 28 may assert a column address strobe (CAS) 36, and the column address latches 20 may latch the transmitted column address.

Once row and column addresses are latched, the row decoder 24 may determine which row of the memory array 14 corresponds to the latched row address, and the row drivers 22 may assert a signal on the selected row. Similarly, the column decoder 18 may determine which column of the memory array 14 corresponds with the latched column address, and the quantizing circuit 16 may quantize (e.g., sense) a voltage or current on the selected column. Additional details of reading and writing are described below.

Figure 3:
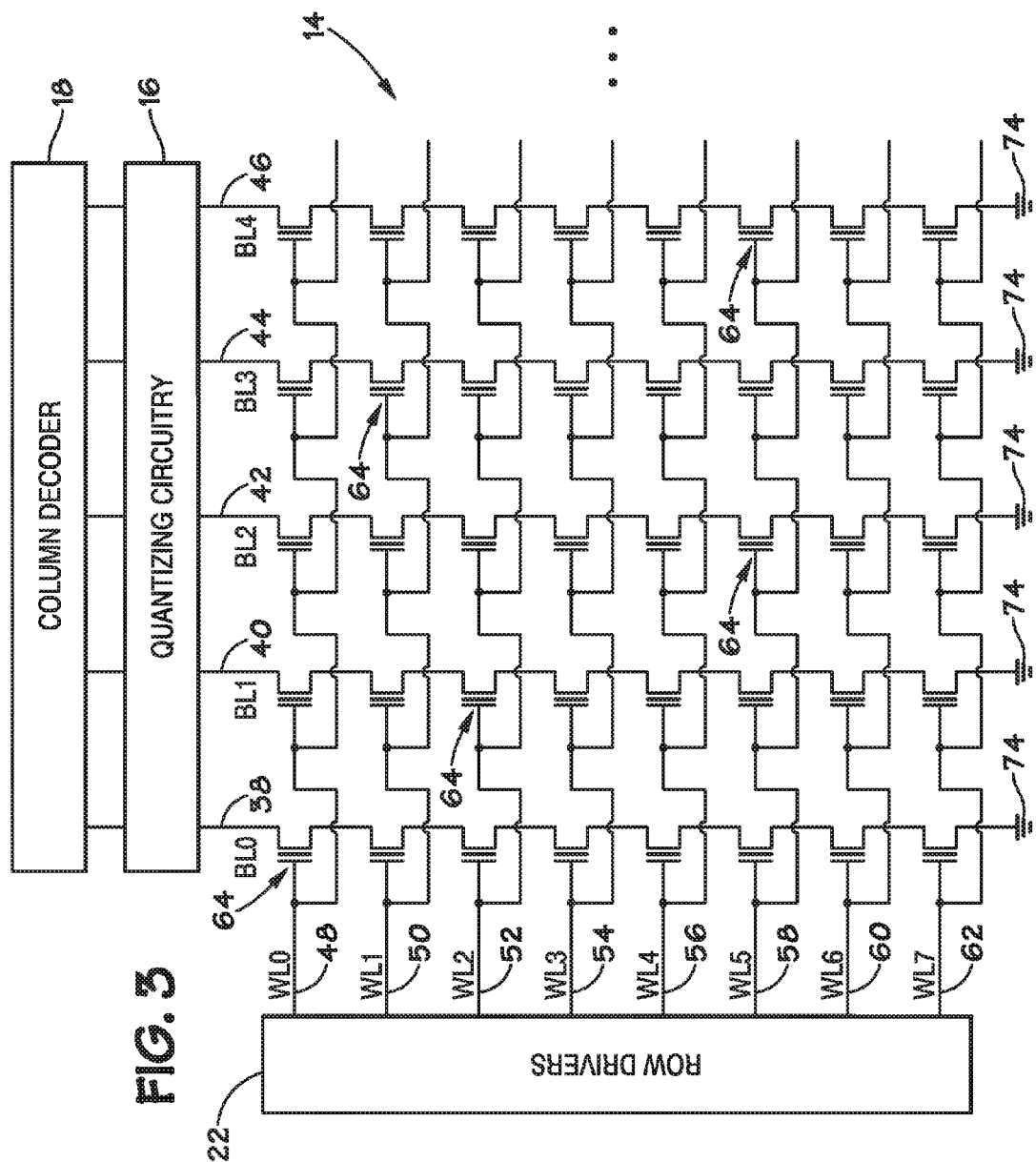
FIG. 3 illustrates a memory array in accordance with an embodiment of the present invention.

FIG. 3 illustrates an example of a memory array 14. The illustrated memory array 14 includes a plurality of bit-lines 38, 40, 42, 44, and 46 (also referred to as BL0-BL4) and a plurality of word-lines 48, 50, 52, 54, 56, 58, 60, and 62 (also referred to as WL0-WL7). These bit-lines and word-lines are examples of electrical conductors. The memory array 14 further includes a plurality of memory elements 64, each of which may be arranged to intersect one of the bit-lines and one of the word-lines. In other embodiments, imaging elements may be disposed at each of these intersections.

The memory elements and imaging elements may be referred to generally as data locations, i.e., devices or elements configured to convey data, either stored or generated by a sensor, when sensed by a sensing circuit, such as the quantizing circuits discussed below. The data locations may be formed on an integrated semiconductor device (e.g., a device formed on a single crystal of silicon) that also includes the other components of the memory device 12 (or imaging device 13).

In some embodiments, the illustrated memory elements 64 are flash memory devices. The operation of the flash memory elements is described further below with reference to the FIGS. 4 and 5. It should be noted that, in other embodiments, the memory elements 64 may include other types of volatile or nonvolatile memory. For example, the memory elements 64 may include a resistive memory, such as a phase change memory or magnetoresistive memory. In another example, the memory elements 64 may include a capacitor, such as a stacked or trench capacitor. Some types of memory elements 64 may include an access device, such as a transistor or a diode associated with each of the memory elements 64, or the memory elements 64 may not include an access device, for instance in a cross-point array.

Figure 4:
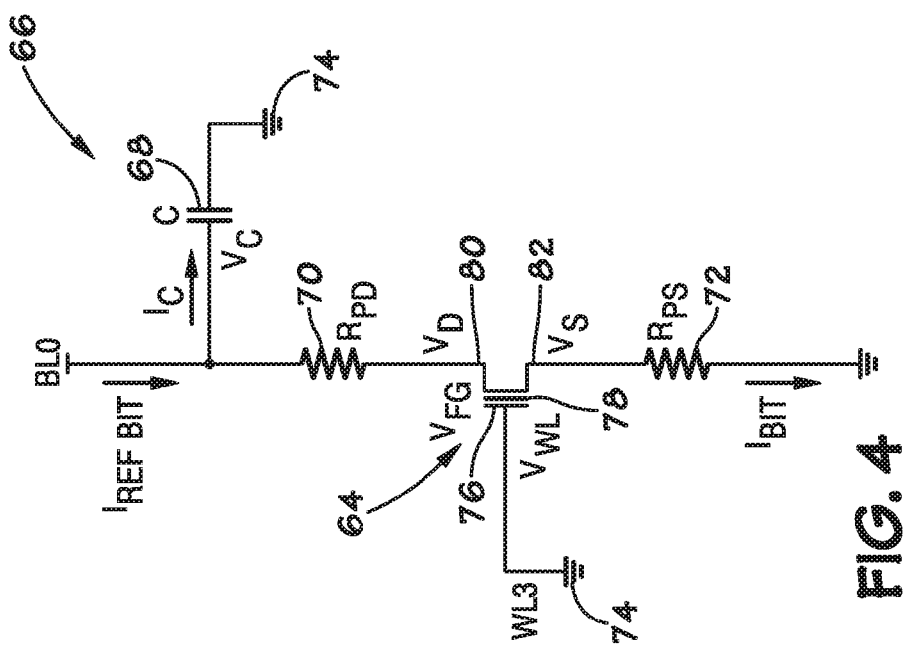
FIG. 4 illustrates a memory element in accordance with an embodiment of the present invention.

FIG. 4 illustrates a circuit 66 that models the operation of an arbitrarily selected memory element 64, which is disposed at the intersection of WL3 and BL0. This circuit 66 includes a capacitor (C) 68 with a corresponding current ($I_C$) and voltage ($V_C$), a pre-drain resistor 70 ($R_{PD}$) through which a current ($I_{REF\ BIT}$), a post-source resistor 72 ($R_{PS}$), and a ground 74. The resistors 70 and 72 model the other devices in series with the memory element 64 being sensed. The illustrated memory element 64 includes a gate 76, a floating gate 78, a drain 80, and a source 82. In the circuit 66, the drain 80 and source 82 are disposed in series between the pre-drain resistor 70 and the post-source resistor 72. The gate 76 is connected to WL3. The pre-drain resistor 70, the drain 80, the source 82, and the post-source resistor 72 are disposed in series on the bit-line BL0. The capacitor 68, which models the capacitance of the bit-line, has one plate connected to ground 74 and another plate connected to the bit-line BL0, in parallel with the memory elements 64.

Several of the components of the circuit 66 represent phenomenon affecting the memory elements 64 when it is sensed. The pre-drain resistor 70 generally represents the drain-to-bitline resistance of the memory elements 64 connected to the bit-line above (i.e., up current from) WL3 when these memory elements 64 are turned on, (e.g., during a read operation). Similarly, the post source resistor 72 generally corresponds to the source-to-ground resistance of the memory elements 64 connected to the bit-line below WL3 when the memory element 64 is sensed. The circuit 66 models electrical phenomena associated with reading the memory elements 64 at the intersection of WL3 and BL0.

Figure 5:
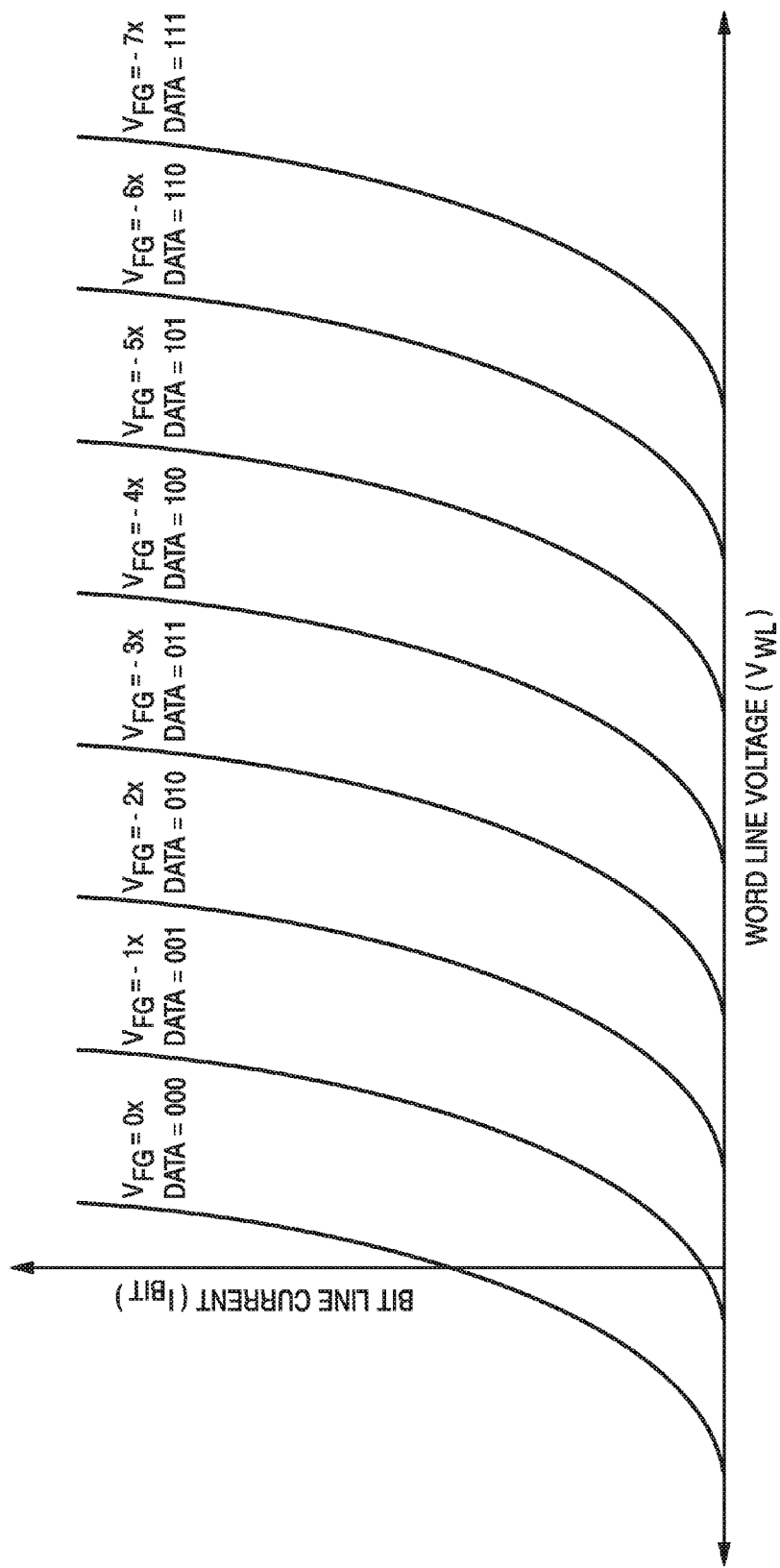
FIG. 5 illustrates I-V traces of memory elements storing different values, in accordance with an embodiment of the present invention.

The operation of the memory elements 64 will now be briefly described with reference to FIGS. 4 and 5. FIG. 5 illustrates one potential relationship between the bit-line current ($I_{BIT}$), the word-line voltage ($V_{WL}$), and the voltage of the floating gate 78 ($V_{FG}$). As illustrated by FIG. 5, $V_{FG}$ affects the response of the memory element 64 to a given $V_{WL}$. Decreasing the voltage of the floating gate shifts the I-V curve of the memory elements 64 to the right. That is, the relationship between the bit-line current and a word-line voltage depends on the voltage of the floating gate 78. The memory elements 64 may store data by exploiting this effect.

To write data to the memory elements 64, a charge corresponding to the data may be stored on the floating gate 78. The charge of the floating gate 78 may be modified by applying voltages to the source ($V_S$) 82, drain ($V_D$) 80, and/or gate 76 such that the resulting electric fields produce phenomenon like Fowler-Northam tunneling and/or hot-electron injection near the floating gate 78. Initially, the memory elements 64 may be erased by applying a word-line voltage designed to drive electrons off of the floating gate 78. In some embodiments, an entire column or block of memory elements 64 may be erased generally simultaneously. Once the memory elements 64 are erased, the gate 76 voltage may be manipulated to drive a charge onto the floating gate 78 that is indicative of a data value. After the write operation ends, the stored charge may remain on the floating gate 78 (i.e., the memory elements 64 may store data in a nonvolatile fashion).

As illustrated by FIG. 5, the value stored by the memory element 64 may be read by applying a voltage, $V_{WL}$, to the gate 76 and quantizing (e.g., categorizing) a resulting bit-line current, $I_{BIT}$. Each of the I-V traces depicted by FIG. 5 correspond to a different charge stored on the floating gate, $V_{FG}$, which should not be confused with the voltage that is applied to the gate, $V_{WL}$. The difference in floating gate 70 voltage, $V_{FG}$, between each I-V trace is an arbitrarily selected scaling factor "x." The illustrated I-V traces correspond to eight-different data values stored by the memory element 64, with a $V_{FG}$ of 0x representing a binary data value of 000, a $V_{FG}$ of −1x representing a binary data value of 001, and so on through $V_{FG}$ of −7x, which represents a binary data value of 111. Thus, by applying a voltage to the gate 76 and measuring the resulting bit-line current, the charge stored on the floating gate 78 may be sensed, and the stored data may be read.

The accuracy with which the bit-line current is quantized may affect the amount of data that a designer attempts to store in each memory element 64. For example, in a system with a low sensitivity, a single bit may be stored on each memory element 64. In such a system, a floating gate voltage $V_{FG}$ of 0x may represent a binary value of 000, and a floating gate voltage $V_{FG}$ of −7x may represent a binary value of 111. Thus, the difference in floating gate voltages $V_{FG}$ corresponding to different data values may be relatively large, and the resulting differences and bit-line currents for different data values may also be relatively large. As a result, even low-sensitivity sensing circuitry may quantize (e.g., discern) these large differences in bit-line current during a read operation. In contrast, high-sensitivity sensing circuitry may facilitate storing more data in each memory element 64. For instance, if the sensing circuitry can distinguish between the eight different I-V traces depicted by FIG. 5, then the memory elements 64 may store three bits. That is, each of the eight different charges stored on the floating gate 78 may represent a different three-bit value: 000, 001, 010, 011, 100, 101, 110, or 111. Thus, circuitry that precisely quantizes the bit-line current $I_{BIT}$ may allow a designer to increase the amount of data stored in each memory element 64.

Figure 6:
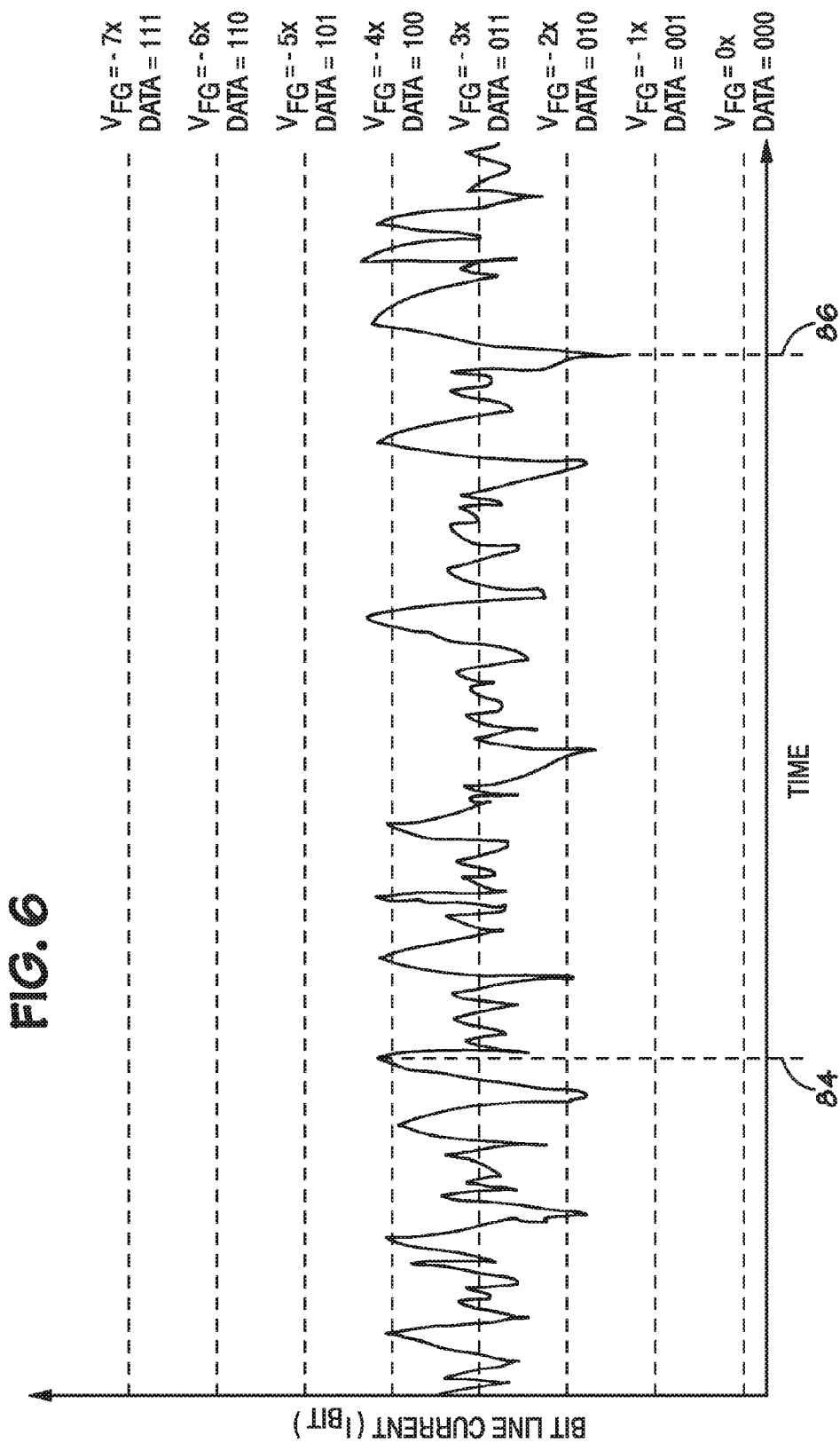
FIG. 6 illustrates noise in the bit-line current during a read operation.

However, as mentioned above, a variety of effects may interfere with accurate measurement of the bit-line current. For instance, the position of the memory elements 64 along a bit-line may affect $R_{PD}$ and $R_{PS}$, which may affect the relationship between the word-line voltage $V_{WL}$ and the bit-line current $I_{BIT}$. To illustrate these effects, FIG. 6 depicts noise on the bit-line while reading from the memory element 64. As illustrated, noise in the bit-line current $I_{BIT}$ may cause the bit-line current $I_{BIT}$ to fluctuate. Occasionally, the fluctuation may be large enough to cause the bit-line current $I_{BIT}$ to reach a level that represents a different stored data value, which could cause the wrong value to be read from the memory elements 64. For instance, if the bit-line current is sensed at time 84, corresponding to an arbitrarily selected peak, a data value of 100 may be read rather than the correct data value of 011. Similarly, if the bit-line current is sensed at time 86, corresponding to an arbitrarily selected local minimum, a data value of 010 may be read rather than a data value of 011. Thus, noise on the bit-line may cause erroneous readings from memory elements 64.

Figure 7:
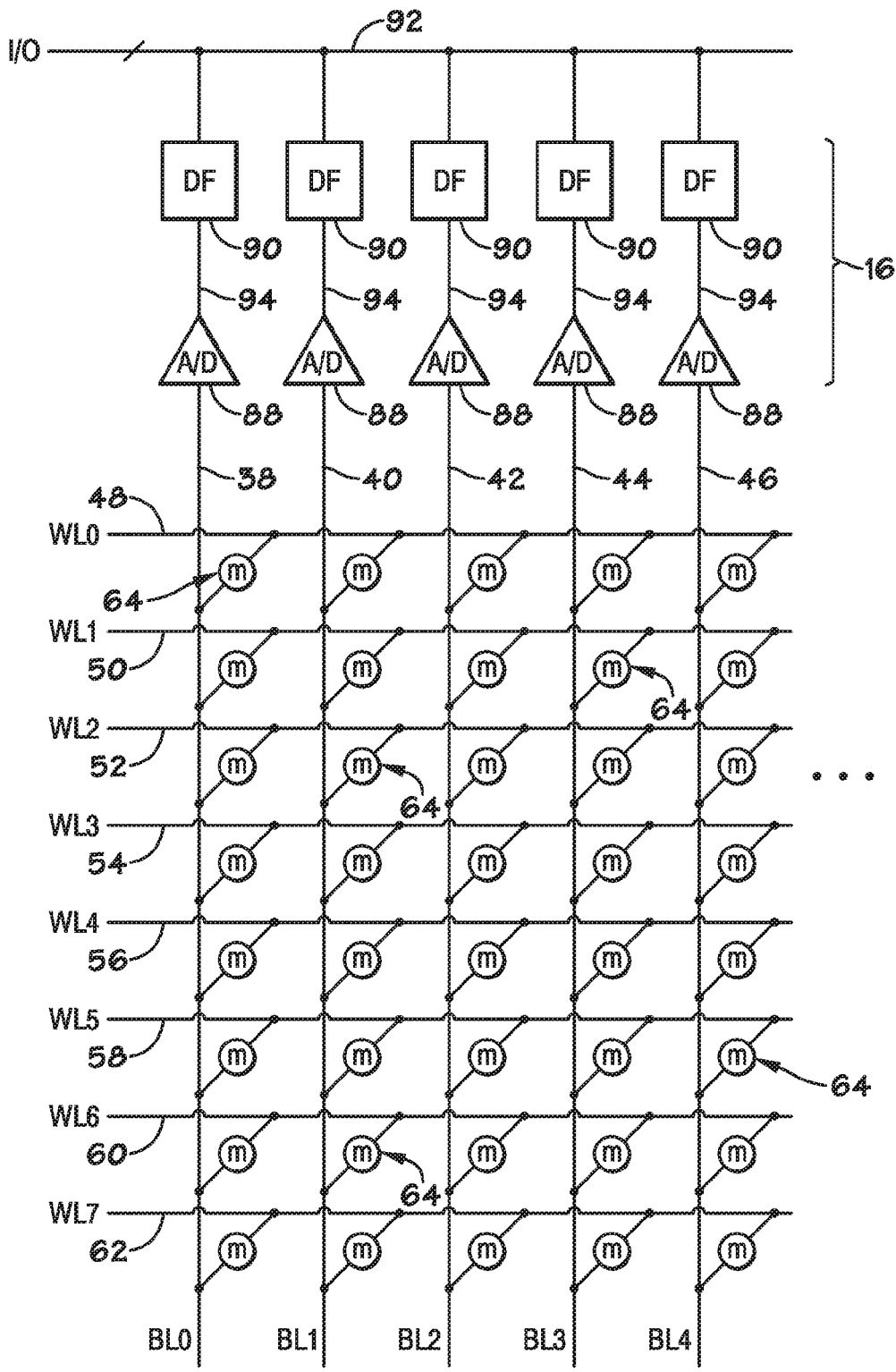
FIG. 7 illustrates a quantizing circuit in accordance with an embodiment of the present invention.

FIG. 7 depicts a quantizing circuit 16 that may tend to reduce the likelihood of an erroneous reading. The illustrated quantizing circuit 16 includes an analog-to-digital (A/D) converter 88 and a digital filter (DF) 90 connected to each of the bit-lines 38, 40, 42, 44, and 46, respectively. Each bit-line 38, 40, 42, 44, and 46 may connect to a different analog-to-digital converter 88 and digital filter 90. The digital filters 90, in turn, may connect to an input/output (I/O) bus 92, which may connect to a column decoder 18, a column address latch 20, and/or control circuitry 28 (see FIG. 2).

In operation, the quantizing circuit 16 may quantize (e.g., digitize) analog signals from the memory elements 64 in a manner that is relatively robust to noise. As explained below, the quantizing circuit 16 may do this by converting the analog signals into a bit-stream and digitally filtering high-frequency components from the bit-stream.

The analog-to-digital converter 88 may be a one-bit, analog-to-digital converter or a multi-bit, analog-to-digital converter. In the present embodiment, an analog-to-digital converter 88 receives an analog signal from the memory element 64, e.g., a bit-line current $I_{BIT}$ or a bit-line voltage $V_{BL}$, and outputs a bit-stream that represents the analog signal. The bit-stream may be a one-bit, serial signal with a time-averaged value that generally represents the time-averaged value of the analog signal from the memory element 64. That is, the bit-stream may fluctuate between values of zero and one, but its average value, over a sufficiently large period of time, may be proportional to the average value of the analog signal from the memory element 64. In certain embodiments, the bit-stream from the analog-to-digital converter 88 may be a pulse-density modulated (PDM) version of the analog signal. The analog-to-digital converter 88 may transmit the bit-stream to the digital filter 90 on a bit-stream signal path 94.

The digital filter 90 may digitally filter high-frequency noise from the bit-stream. To this end, the digital filter 90 may be a low-pass filter, such as a counter, configured to average (e.g., integrate and divide by the sensing time) the bit-stream over a sensing time, i.e., the time period over which the memory element 64 is read. (Alternatively, in some embodiments, the digital filter 90 is configured to integrate the bit-stream without dividing by the sensing time.) As a result, the digital filter 90 may output a value that is representative of both the average value of the bit-stream and the average value of the analog signal from the memory element 64. In some embodiments, the digital filter 90 is a counter, and the cut-off frequency of the digital filter 90 may be selected by adjusting the duration of the sensing time. In the present embodiment, increasing the sensing time will lower the cutoff frequency. That is, the frequency response of the digital filter 90 may be modified by adjusting the period of time over which the bit-stream is integrated and/or averaged before outputting a final value. The frequency response of the digital filter 90 is described further below with reference to FIG. 15. For multi-bit memory elements 64, the output from the digital filter 90 may be a multi-bit binary signal, e.g., a digital word that is transmitted serially and/or in parallel.

Advantageously, in certain embodiments, the quantizing circuit 16 may facilitate the use of multi-bit memory elements 64. As described above, in traditional designs, the number of discrete data values that a memory element 64 stores may be limited by sense amps that react to noise. In contrast, the quantizing circuit 16 may be less susceptible to noise, and, as a result, the memory elements 64 may be configured to store additional data. Without the high frequency noise, the intervals between signals representative of different data values may be made smaller, and the number of data values stored by a given memory element 64 may be increased. Thus, beneficially, the quantizing circuit 16 may read memory elements 64 that store several bits of data, e.g., 2, 3, 4, 5, 6, 7, 8, or more bits per memory element 64.

Although the quantizing circuit 16 may sense the signal from the memory element 64 over a longer period of time than conventional designs, the overall speed of the memory device 12 may be improved. As compared to a conventional device, each read or write operation of the memory device 12 may transfer more bits of data into or out of the memory element 64. As a result, while each read or write operation may take longer, more data may be read or written during the operation, thereby improving overall performance. Further, in some memory devices 12, certain processes may be performed in parallel with a read or write operation, thereby further reducing the overall impact of the longer sensing time. For example, in some embodiments, the memory array 14 may be divided into banks that operate at least partially independently, so that, while data is being written or read from one bank, another bank can read or write data in parallel.

Figure 8:
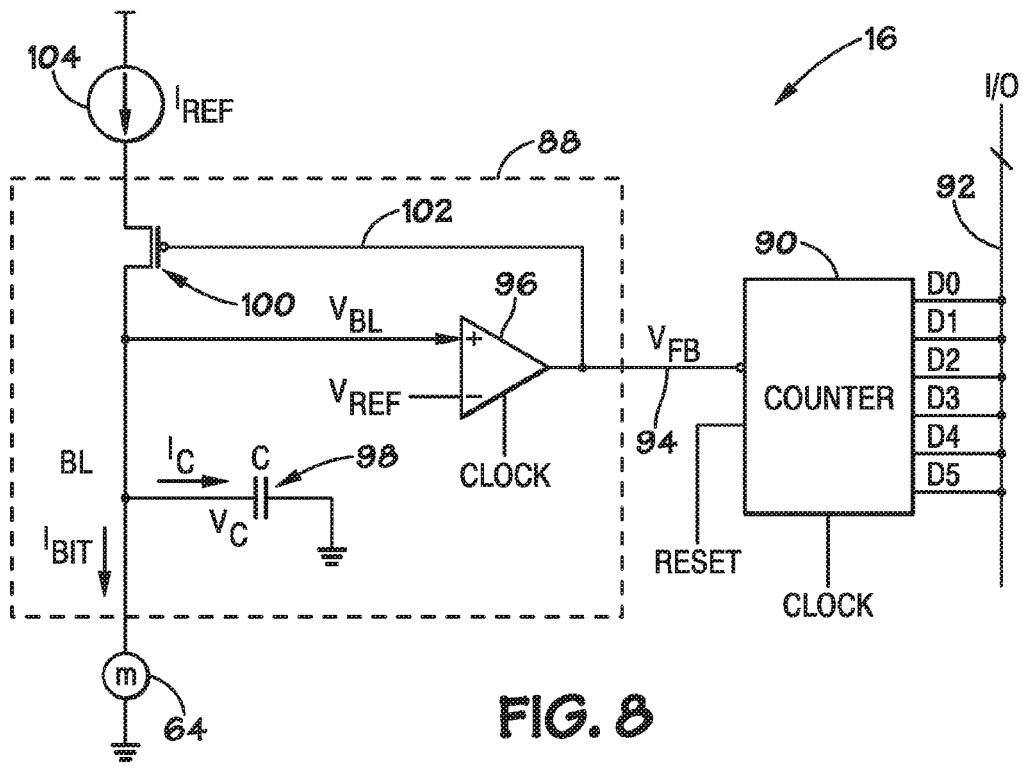
FIG. 8 illustrates a delta-sigma sensing circuit in accordance with an embodiment of the present invention.

FIG. 8 illustrates details of one implementation of the quantizing circuit 16. In this embodiment, the digital filter 90 is a counter, and the analog-to-digital converter 88 is a first-order delta-sigma modulator. The illustrated delta-sigma modulator 88 may include a latched comparator 96, a capacitor 98, and a switch 100. In other embodiments, other types of digital filters and analog-to-digital converters may be employed, such as those described below in reference to FIGS. 17 and 18.

As illustrated, an input of the counter 90 may connect to the bit-stream signal path 94, which may connect to an output of the comparator 96. The output of the comparator 96 may also connect to a gate of the switch 100 by a feedback signal path 102. The output terminal (e.g., source or drain) of the switch 100 may connect in series to one of the bit-lines 38, 40, 42, 44, or 46, and the input terminal of the switch 100 may connect to a reference current source 104 ($I_{REF}$). One plate of the capacitor 98 may connect to one of the bit-lines 38, 40, 42, 44, or 46, and the other plate of the capacitor 98 may connect to ground.

The illustrated counter 90 counts the number of clock cycles of a clock signal (CLOCK) that the bit-stream 94 is at a logic high value or logic low value during the sensing time. The counter may count up or count down, depending on the embodiment. In some embodiments, the counter 90 may do both, counting up one for each clock cycle that the bit-stream has a logic high value and down one for each clock cycle that the bit-stream has a logic low value. Output terminals (D0-D5) of the counter 90 may connect to the input/output bus 92 for transmitting the count. The counter 90 may be configured to be reset to zero or some other value when a reset signal (RESET) is asserted. In some embodiments, the counter 90 may be a series connection of D-flip flops, e.g., D-flip flops having SRAM or other memory for storing an initial value and/or values to be written to the memory element 64.

In the illustrated embodiment, the clocked comparator 96 compares a reference voltage ($V_{REF}$) to the voltage of one of the bit-lines 38, 40, 42, 44, or 46 ($V_{BL}$), which may be generally equal to the voltage of one plate of the capacitor 98. The comparator 96 may be clocked (e.g., falling and/or rising edge triggered), and the comparison may be performed at regular intervals based on the clock signal, e.g., once per clock cycle. Additionally, the comparator 96 may latch, i.e., continue to output, values ($V_{FB}$) between comparisons. Thus, when the clock signals the comparator 96 to perform a comparison, if $V_{BL}$ is less than $V_{REF}$ ($V_{BL} < V_{REF}$), then the comparator 96 may latch its output to a logic low value, as described below in reference to FIG. 9. Conversely, if $V_{BL}$ is greater than $V_{REF}$ ($V_{BL} > V_{REF}$), then the comparator 96 may latch a logic high value on its output, as described below in reference to FIG. 10. As a result, the illustrated comparator 96 outputs a bit-stream that indicates whether $V_{BL}$ is larger than $V_{REF}$, where the indication is updated once per clock cycle.

Advantageously, in some embodiments, the quantizing circuit 16 may include a single comparator (e.g., not more than one) for each column of multi-level memory elements 64. In contrast, conventional sense amplifiers often include multiple comparators to read from a multi-bit memory cell, thereby potentially increasing device complexity and cost.

The capacitor 98 may be formed by capacitive coupling of the bit-lines 38, 40, 42, 44, and 46. In other designs, this type of capacitance is referred to as parasitic capacitance because it often hinders the operation of the device. However, in this embodiment, the capacitor 98 may be used to integrate differences between currents on the bit-lines 38, 40, 42, 44, or 46 and the reference current to form the bit-stream, as explained further below. In some embodiments, the capacitor 98 may be supplemented or replaced with an integrated capacitor that provides greater capacitance than the "parasitic" bit-line capacitance.

Figure 9:
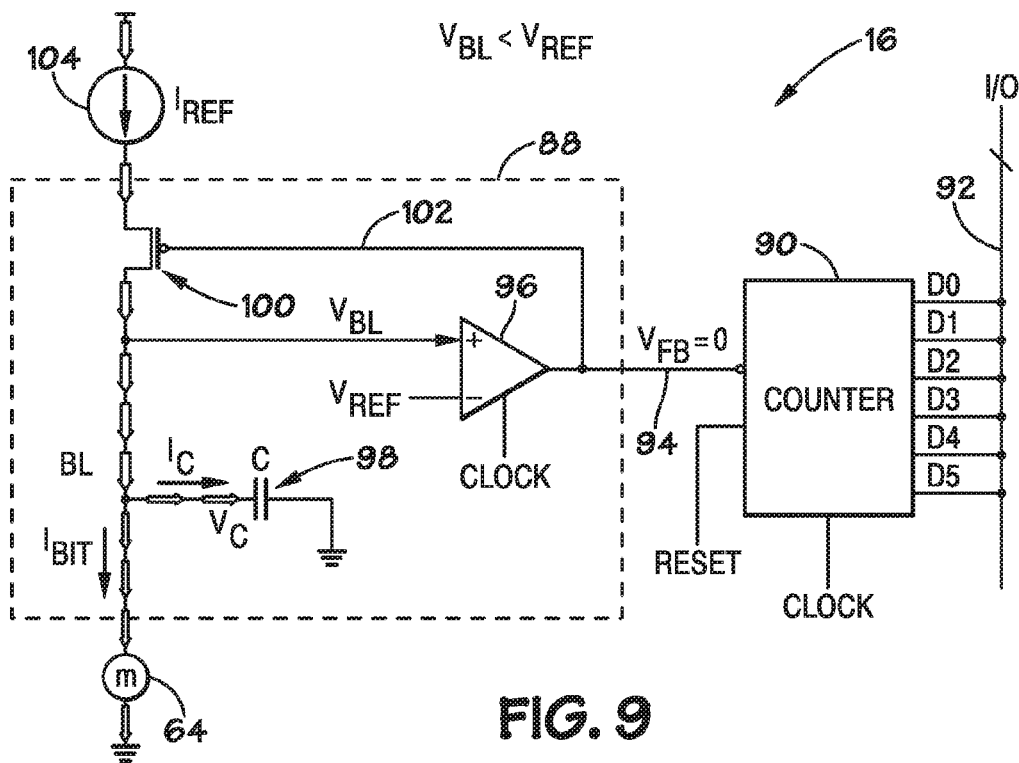
FIGS. 9 and 10 illustrate current flow during operation of the quantizing circuit of FIG. 8.
Figure 10:
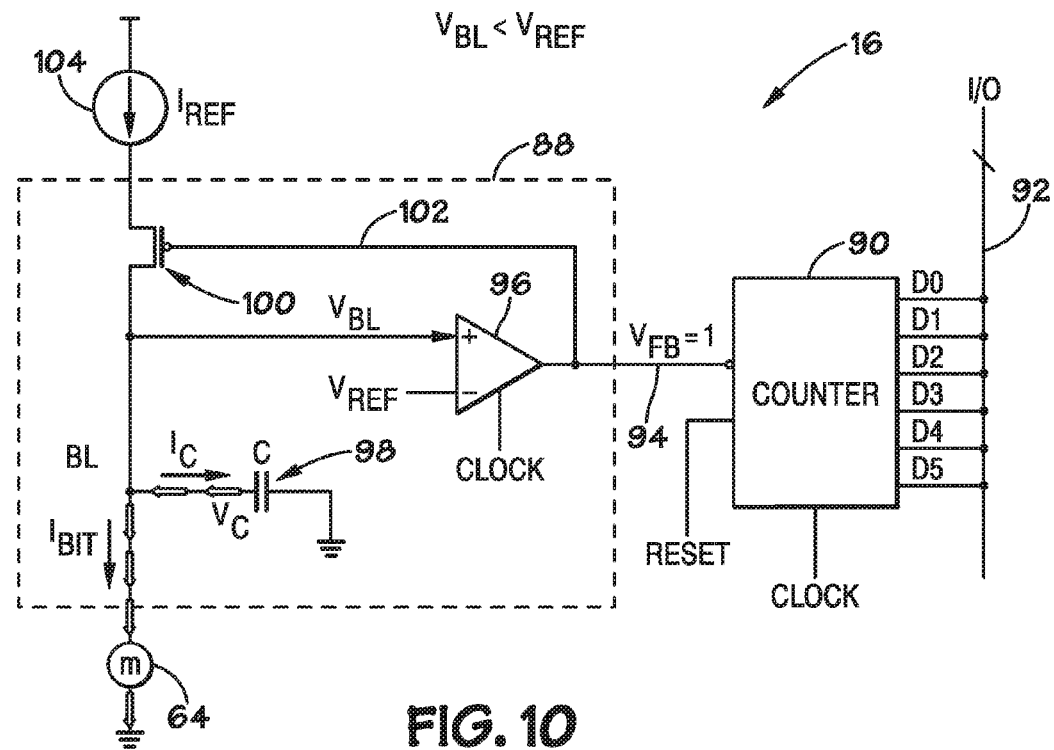
Figure 17:
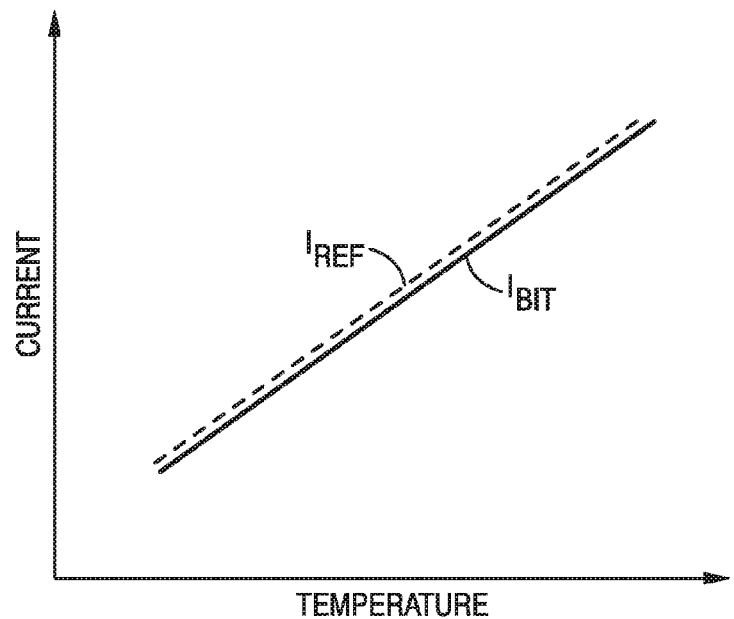
FIG. 17 is a graph of current versus temperature for two of the transistors in the reference current source of FIG. 16.

The illustrated switch 100 selectively transmits current $I_{REF}$ from the reference current source 104. In various embodiments, the switch 100 may be a PMOS transistor (as illustrated in FIGS. 8-10) or an NMOS transistor (as illustrated in FIG. 17) controlled by the $V_{FB}$ signal on the feedback signal path 102.

Figure 13:
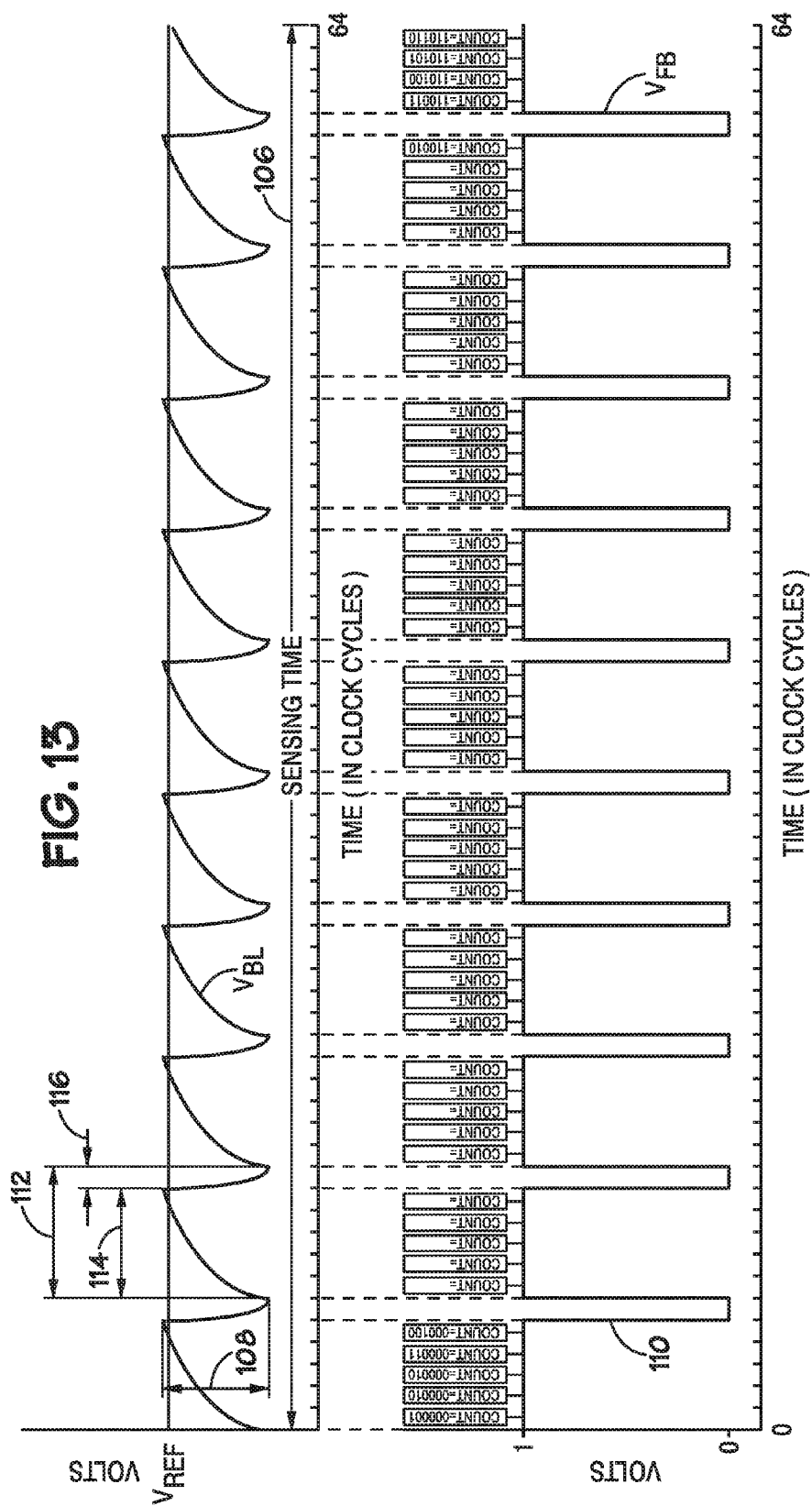

The operation of the quantizing circuit 16 will now be described with reference to FIGS. 9-12. Specifically, FIGS. 9 and 10 depict current flows in the quantizing circuit 16 when the comparator 96 is latched low and high, respectively. FIG. 11 illustrates $V_{BL}$, the bit-stream output from the comparator 96, and the corresponding increasing count of the counter 90 for a relatively small bit-line current. FIG. 12 depicts the same voltages when measuring a medium sized bit-line current, and FIG. 13 depicts these voltages when measuring a relatively large bit-line current.

To sense the current through the memory element 64, the illustrated delta-sigma modulator 88 exploits transient effects to output a bit-stream representative of the bit-line current $I_{BIT}$. Specifically, the delta-sigma modulator 88 may repeatedly charge and discharge the capacitor 98 with a current divider that subtracts the bit-line current $I_{BIT}$ from the reference current $I_{REF}$. Consequently, a large current through the memory element 64 may rapidly discharge the capacitor 98, and a small current through the memory element 64 may slowly discharge the capacitor 98.

To charge and discharge the capacitor 98, the delta-sigma modulator 88 switches between two states: the state depicted by FIG. 9 (hereinafter "the charging state") and the state depicted by FIG. 10 (hereinafter "the discharging state").

Each time the delta-sigma modulator 88 transitions between these states, the bit-stream changes from a logic high value to a logic low value or vice versa. The proportion of time that the delta-sigma modulator 88 is in the state illustrated by either FIG. 9 or FIG. 10 may be proportional to the size of the bit-line current $I_{BIT}$ through the memory element 64. The larger the bit-line current $I_{BIT}$, the more time that the delta-sigma modulator 88 is in the state illustrated by FIG. 9, rather than the state illustrated by FIG. 10, and the more time that the bit-stream has a logic low value.

Starting with the charging state (FIG. 9), the capacitor 98 may initially accumulate a charge (e.g., become more charged). To this end, the output of the comparator 96 is latched to logic low, which, as mentioned above, may occur when $V_{BL}$ is less than $V_{REF}$. The logic low may be conveyed to switch 100 by the feedback signal path 102, and the switch 100 may close, thereby conducting the reference current $I_{REF}$ through one of the bit-lines 38, 40, 42, 44, or 46, as indicated by the larger arrows in FIG. 9. A portion of the electrons flowing through the reference current source 104 may be accumulated by the capacitor 98, as indicated by the smaller-horizontal arrows, and the remainder may be conducted through the memory element 64, i.e., the bit-line current $I_{BIT}$, as indicated by the smaller vertical arrows. Thus, the capacitor 98 may accumulate a charge, and $V_{BL}$ may increase.

The comparator 96 and the reference current source 104 may cooperate to charge the capacitor 98 for a discrete number of clock cycles. That is, when the delta-sigma modulator 88 transitions to the charging state, the delta-sigma modulator 88 may remain in this state for an integer number of clock cycles. In the illustrated embodiment, the comparator 96, the output of which is latched, changes state no more than once per clock cycle, so the switch 100, which is controlled by the output of the comparator 96, $V_{FB}$, conducts current for a discrete number of clock cycles. As a result, the reference current source 104 conducts current $I_{REF}$ through the bit-line and into the capacitor 98 for an integer number of clock cycles.

After each clock cycle of charging the capacitor 98, the delta-sigma modulator 88 may transition from the charging state to the discharging state, which is illustrated by FIG. 10, depending on the relative values of $V_{BL}$ and $V_{REF}$. Once per clock cycle (or at some other appropriate interval, such as twice per clock cycle), the comparator 96 may compare the voltage of the capacitor $V_{BL}$ to the reference voltage $V_{REF}$. If the capacitor 98 has been charged to the point that $V_{BL}$ is greater than $V_{REF}$, then the output of the comparator 96 may transition to logic high, as illustrated in FIG. 10. The logic high signal may be conveyed to the switch 100 by the feedback signal path 102, thereby opening the switch 100. As a result, the reference current source 104 may cease conducting current through the memory element 64 and into the capacitor 98, and the capacitor 98 may begin to discharge through the memory element 64.

In the present embodiment, the delta-sigma modulator 88 discharges the capacitor 98 for a discrete number of clock intervals. After each clock cycle of discharging the capacitor 98, the delta-sigma modulator 88 compares $V_{BL}$ to $V_{REF}$. If $V_{BL}$ is still greater than $V_{REF}$, then the comparator 96 may continue to output a logic high signal, i.e., $V_{FB}=1$, and the switch 100 remains open. On the other hand, if enough current has flowed out of the capacitor 98 that $V_{BL}$ is less than $V_{REF}$, then the comparator 96 may output a logic low signal, i.e., $V_{FB}=0$, and the switch 100 may close, thereby transitioning the delta-sigma modulator 88 back to the charging state and initiating a new cycle.

The counter 90 may count the number of clock cycles that the delta-sigma modulator 88 is in either the charging state or the discharging state by monitoring the bit-stream signal path 94. The bit-stream signal path 94 may transition back and forth between logic high and logic low with the output of the comparator 96, $V_{FB}$, and the counter 90 may increment and/or decrement a count once per clock cycle (or other appropriate interval) based on whether the bit-stream is logic high or logic low. After the sensing time has passed, the counter 90 may output a signal indicative of the count on output terminals D0-D5. As explained below, the count may correspond, e.g., proportionally, to the bit-line current, $I_{BIT}$.

FIGS. 11-13 illustrate voltages $V_{FB}$ and $V_{BL}$ in the quantizing circuit 16 when reading data from a memory element 64. Specifically, FIG. 11 illustrates a low-current case, in which the value stored by the memory element 64 is represented by a relatively low bit-line current. Similarly, FIG. 12 illustrates a medium-current case, and FIG. 13 illustrates a high-current case. In each of these figures, the ordinate of the lower trace represents the voltage of the bit-stream signal path 94, $V_{FB}$, and the ordinate of the upper trace illustrates the bit-line voltage, $V_{BL}$. The abscissa in each of the traces represents time, with the lower trace synchronized with the upper trace, and the duration of the time axes is one sensing time 106.

As illustrated by FIG. 11, the counter 90 is initially preset to zero (or some other appropriate value) by applying a reset signal. In some embodiments, the delta-sigma modulator 88 may undergo a number of start-up cycles to reach steady-state operation before initiating the sensing time and resetting the counter 90. At the beginning of the illustrated read operation, the delta-sigma modulator 88 is in the charging state, which charges the capacitor 98 and increases $V_{BL}$, as indicated by dimension arrow 108. At the beginning of the next clock cycle, the comparator 96 compares the bit-line voltage to the reference voltage and determines that the bit-line voltage is greater than the reference voltage. As a result, the bit-stream signal path 94 ($V_{FB}$) transitions to a logic high voltage, and the delta-sigma modulator 88 transitions to the discharging state. Additionally, the counter 90 increments the count by one to account for one clock cycle of the bit-stream signal 94 holding a logic low value. Next, the charge stored on the capacitor 98 drains out through the memory element 64, and the bit-line voltage drops until the comparator 96 determines that $V_{BL}$ is less than $V_{REF}$, at which point the cycle repeats. The cycle has a period 112, which may be divided into a charging portion 114 and a discharging portion 116. Once during each cycle in the sensing time 106, the count stored in the counter 90 may increase by one. At the end of the sensing time 106, the counter 90 may output the total count.

A comparison of FIG. 11 to FIGS. 12 and 13 illustrates why the count correlates with the bit-line current. In FIG. 13, the high-current case, the stored charge drains from the capacitor 98 quickly, relative to the other cases, because the bit-line current $I_{BIT}$ is large and, as a result, the delta-sigma modulator 88 spends more time in the charging state than the discharging state. As a result, the bit-stream has a logic low value for a large portion of the sensing time 106, thereby increasing the count.

The capacitance of the capacitor 98 may be selected with both the clock frequency and the range of expected bit-line currents in mind. For example, the capacitor 98 may be large enough that the capacitor 98 does not fully discharge (e.g., saturate) when the bit-line current $I_{BIT}$ is either at its lowest expected value or at its highest expected value. That is, in some embodiments, the capacitor 98 generally remains in a transient state while reading the memory element 64. Similarly, the frequency at which the comparator 96 is clocked may affect the design of the capacitor 98. A relatively high frequency clock signal may leave the capacitor 98 with relatively little time to discharge or saturate between clock cycles, thereby leading a designer to choose a smaller capacitor 98.

Similarly, the size of the reference current may be selected with the range of expected bit-line currents in mind. Specifically, in certain embodiments, the reference current is less than the largest expected bit-line current $I_{BIT}$, so that, in the case of maximum bit-line current $I_{BIT}$, the capacitor 98 can draw charge from the reference current while the rest of the reference current flows through the memory element 64.

Figure 14:
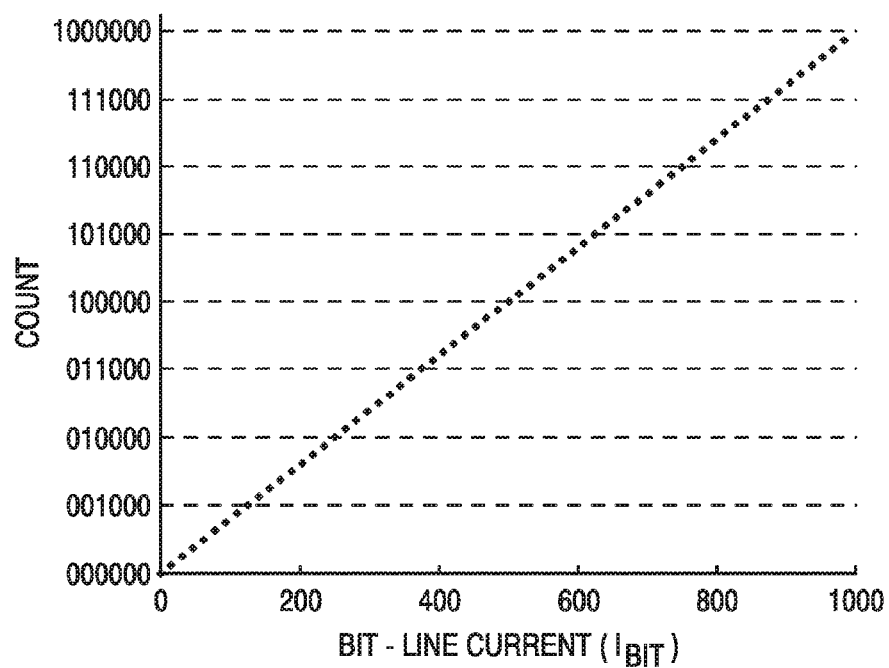
FIG. 14 is a graph of bit-line current versus counter output for the quantizing circuit of FIG. 8.

FIG. 14 illustrates the relationship between the bit-line current $I_{BIT}$ and the count for the presently discussed embodiment. As illustrated by FIG. 14, the count corresponds with (e.g., is generally proportional to) the bit-line current $I_{BIT}$. This relationship is described by the following equation (Equation 1), in which $N_{ST}$ represents the number of clock cycles during the sensing time:

$$I_{BIT}/I_{REF} = \text{Count}/N_{ST}$$

Thus, in the illustrated embodiment, the count corresponds with (e.g., is indicative of) the bit-line current $I_{BIT}$, which corresponds with the value stored by the memory element 64.

Advantageously, the quantizing circuit 16 may quantize (e.g., categorize) the bit-line current $I_{BIT}$ as falling into one of a large number of categories, each of which is represented by an increment of the count. In doing so, in some embodiments, the quantizing circuit 16 may resolve small differences in the bit-line current $I_{BIT}$. The resolution of the quantizing circuit 16 may be characterized by the following equation (Equation 2), in which $I_{MR}$ represents the smallest resolvable difference in bit-line current $I_{BIT}$, i.e., the resolution of the quantizing circuit 16:

$$I_{MR} = I_{REF}/N_{ST}$$

Thus, the resolution of the quantizing circuit 16 may be increased by increasing the sensing time or the clock frequency or by decreasing $I_{REF}$, which may limit the maximum cell current since $I_{MR}$ is less than $I_{REF}$.

The resolution of the quantizing circuit 16 may facilitate storing multiple bits in the memory element 64 or sensing multiple levels of light intensity in an image sensor element. For example, if the quantizing circuit 16 is configured to quantize (e.g., categorize) the bit-line current $I_{BIT}$ into one of four different levels, then the memory element 64 may store two-bits of data or, if the quantizing circuit 16 is configured to categorize the bit-line current $I_{BIT}$ into one of eight different current levels, then the memory element 64 may store three-bits of data. For the present embodiment, the number of bits stored by the memory element 64 may be characterized by the following equation (Equation 3), in which $N_B$ represents the number of bits stored by a memory element 64 and $I_{RANGE}$ represents the range of programmable bit-line currents through the memory element 64:

$$N_B = \log(I_{RANGE}/I_{MR})/\log 2$$

In short, in the present embodiment, greater resolution translates into higher density data storage for a given memory element 64.

Figure 15:
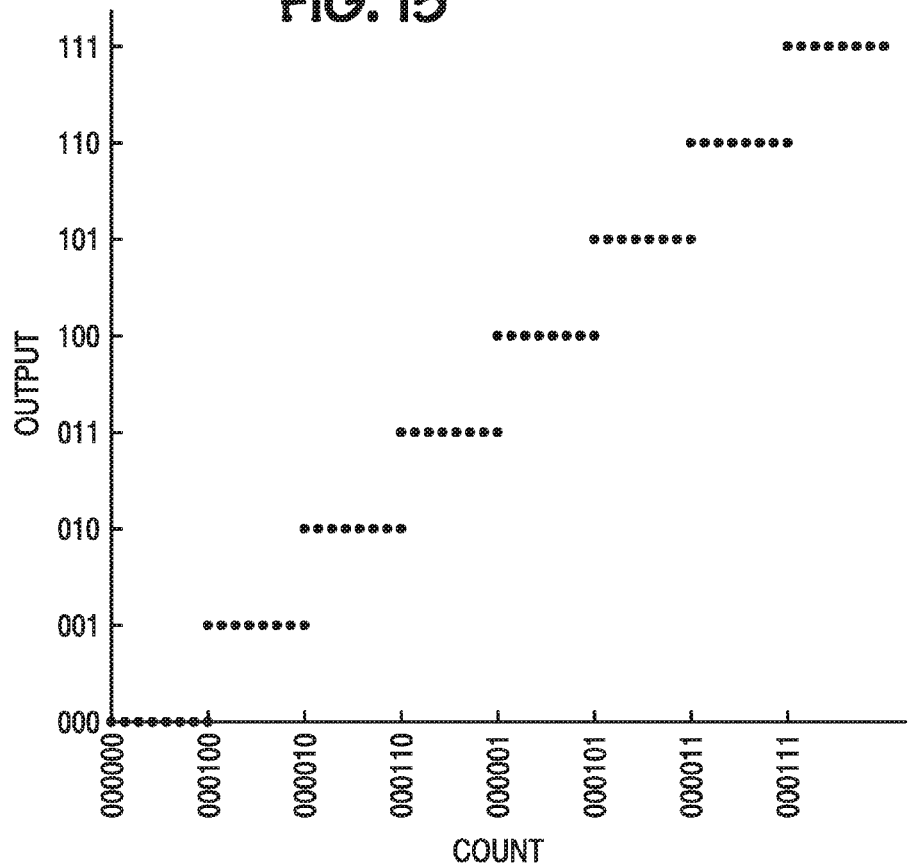
FIG. 15 is a graph of count versus quantizing circuit output in accordance with an embodiment of the present invention.

FIG. 15 is a graph that illustrates one way in which the counter 90 may be configured to further reduce the effects of noise. In FIG. 15, the abscissa represents the count, and the ordinate represents the output of the quantizing circuit 16. In the present embodiment, the three-least-significant digits of the count are disregarded as potentially corrupted by noise. That is, D0-D2 (FIG. 8) either do not connect to the input/output bus 92 or are not interpreted as conveying data that is stored by the memory element 64. As a result, a range of counter values may represent a single data value stored by the memory element 64. For example, in the present embodiment, count values ranging from 00 1000 to 00 1111 are construed as representing a data value of 001. Representing data in this manner may further reduce the effects of noise because, even if noise affects the count, in many embodiments, it would have to affect the count in a consistent manner over a substantial portion of the sensing time to affect the more significant digits of the count. That is, disregarding less significant digits may lower the cutoff frequency of the counter 90. In other embodiments, fewer, more, or no digits may be truncated from the count as potentially representing noise.

Truncating less significant digits may introduce a rounding error, or a downward bias, in the output. This effect may be mitigated by presetting (e.g., driving latches to a particular state in advance of counting or storing a value in memory) the counter 90 in a manner that accounts for this bias. The counter 90 may be preset either before reading from the memory element 64 or before writing to the memory element 64. In some embodiments, the preset value may be one-half of the size of the range of counter values that represent a single output value. In other words, if m digits are truncated from the output, then the counter 90 may be preset to one-half of $2^m$ before reading from a memory element 64 or before writing to the memory element 64. In some embodiments, the memory in the counter 90 may store this preset value.

While truncating less significant digits may generally reduce the effect of noise, other techniques may target specific sources of noise. As briefly mentioned above, one of these sources is temperature variations. Changes in temperature may affect how a data location responds to a stimulus. For example, in certain regimes, increasing the temperature of a floating gate transistor may cause the floating gate transistor to behave as if it is storing a larger data value than it actually is. This is because increasing the temperature of the floating gate transistor may increase its drain current even though the charge on the floating gate has not changed. Heat may also mask the programmed resistance of resistive memories by increasing their resistance and potentially making them appear as if they are storing a different data value. In short, changes in the temperature of a data location may decrease margins. However, this effect may be mitigated by several embodiments of a reference current source that are described below.

Figure 16:
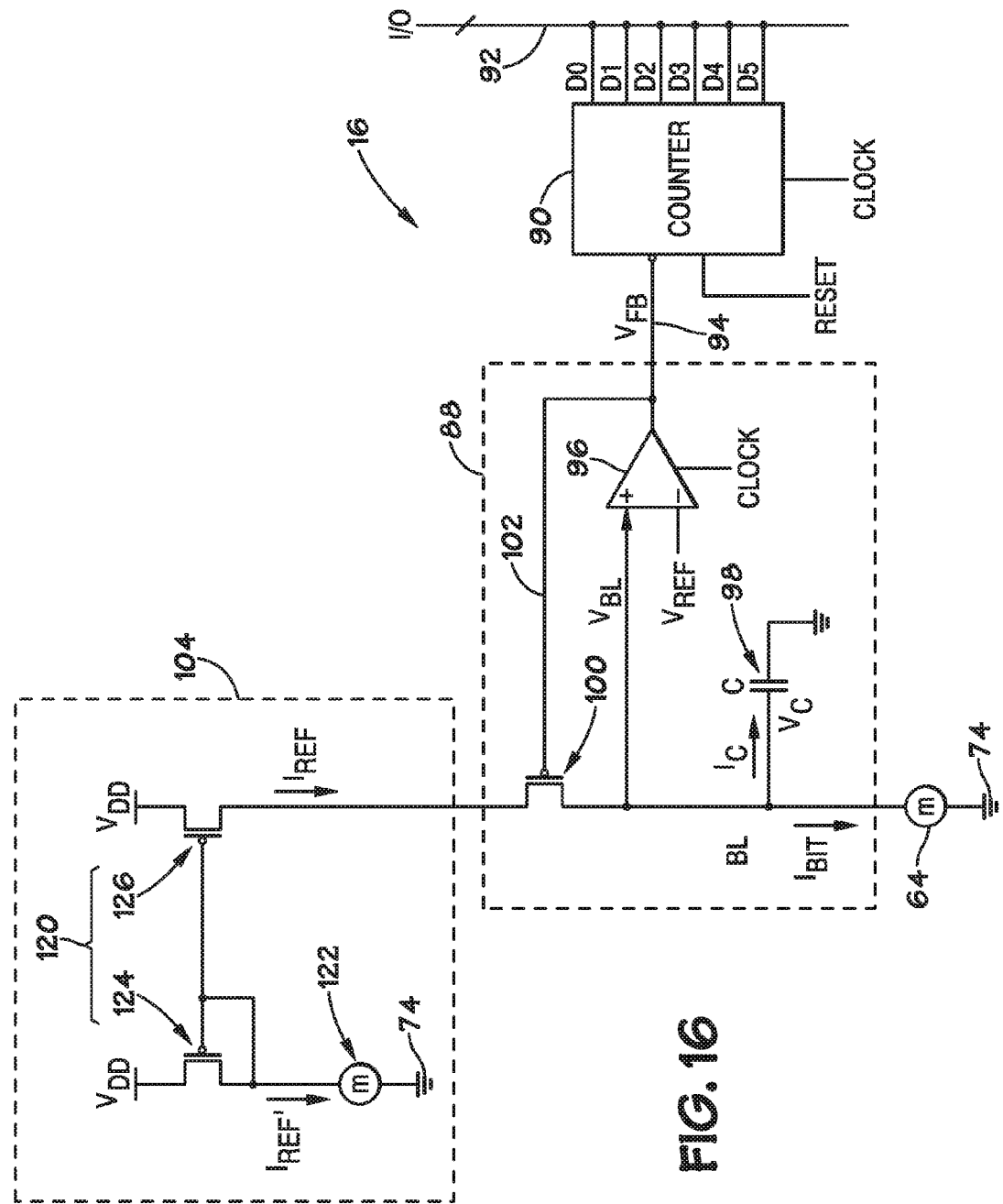
FIG. 16 illustrates an example of a reference current source in accordance with an embodiment of the present invention.

FIG. 16 illustrates additional details of the quantizing circuit 16 of FIG. 8. Specifically, this figure illustrates an embodiment of the reference current source 104 that may address one or more of the above-mentioned problems relating to temperature variations. The illustrated reference current source 104 includes a current mirror 120 and a data location 122. The illustrated current mirror 120 includes two transistors 124 and 126 with their gates coupled both to one another and to the drain of the transistors 124. The drain of the transistor 124 may also couple to ground 74 via the data location 122.

The data location 122 may, in certain embodiments, be the same type of data location as the data location 64 that is being read by the quantizing circuit 16. For instance, both the data locations 122 and 64 may be floating gate transistors, phase change memory elements, or other types of resistive memory. In some embodiments, the data location 122 may be the same type as data location 64, but with different properties. For instance, the data location 122 may be a floating gate transistor with a wider channel or a different value stored on its floating gate than the data location 64. Reasons for selecting certain properties of the data location 122 are described below. To distinguish these data locations 64 and 122, the data location 122 may be referred to as a reference device, i.e., a device of the same type as the data location being sensed.

In operation, the reference current source 104 may conduct an auxiliary reference current $I_{REF'}$ through the data location 122 and mirror the auxiliary reference current to the bit-line, thereby conducting the reference current $I_{REF}$. The size of the auxiliary reference current may be determined by the properties of the data location 122. Specifically, the auxiliary reference current may vary proportionally with the resistance of the data location 122. This current $I_{REF'}$, in turn, may be mirrored by the current mirror 120, which may maintain a relatively constant reference current $I_{REF}$ even though the voltage drop between its source and its drain ($V_{SD}$) may vary. That is, the reference current $I_{REF}$ may be relatively insensitive to the $V_{SD}$ of the transistor 126.

When the temperature changes, the reference current source 104 may counteract the temperature induced variation in the data location 64. As explained above, changes in temperature may cause the data location 64 to conduct more or less current regardless of the data value that it stores, thereby potentially making it appear to store a different value than it does. The reference current source 104, in the present embodiment, may track the temperature response of the data location 64 and compensate for it. Because the data locations 64 and 122 are of the same type (e.g., both floating gate transistors), the data location 122 may be affected by temperature changes in the same way as data location 64 that is being sensed. As a result, the auxiliary reference current $I_{REF'}$ may vary with temperature, which in turn, may cause the reference current $I_{REF}$ to vary with temperature. Below, this variation is described before describing how this variation is believed to compensate for variation of the data location 64.

FIG. 17 illustrates the reference current $I_{REF}$ tracking the bit line current $I_{BIT}$ over a range of temperatures. As illustrated, as temperature increases, all other things being generally equal, the bit line current $I_{BIT}$ also increases. Further, because the reference current $I_{REF}$ is regulated by another data location 122, it increases along with the bit line current $I_{BIT}$ as temperature changes. That is, in this embodiment, the reference current $I_{REF}$ changes in sympathy (e.g., proportionally or generally identically) with the bit-line current $I_{BIT}$.

It should be noted that, in other embodiments, or in other operating regimes, the slope of the lines illustrated by FIG. 17 may change. For instance, at higher temperatures, the slope of the lines may invert and they may curve and slope down to the right. However, regardless of the curvature or the slope, in the present embodiment, the reference current $I_{REF}$ may track the bit-line current $I_{BIT}$ as temperature changes. That is, the reference current $I_{REF}$ may be correlated with the bit-line current $I_{BIT}$ as the bit-line current $I_{BIT}$ changes with temperature.

Advantageously, the reference current source 104 may reduce noise from changes in temperature. As explained above, this noise arises when data is written to the data location 64 at one temperature and read from the data location 64 at another temperature. The change in temperature may cause the data location 64 to appear as if it is storing a different value. However, in the present embodiment, this affect may be reduced by letting the reference current $I_{REF}$ vary with temperature changes in a similar manner. As explained above in reference to FIGS. 11-13, the illustrated delta-sigma modulator 88 reads data from the data location 64 by measuring a ratio of the bit line current $I_{BIT}$ to the reference current $I_{REF}$. In this embodiment, a large bit-line current $I_{BIT}$ relative to the reference current $I_{REF}$ causes the delta sigma modulator 88 to close the current switch 102 for a large proportion of the sensing time, and the counter 90 registers this by outputting a large digital number that is representative of the values stored by the data location 64. Temperature variations may cause problems because, if only the bit line current $I_{BIT}$ changes with temperature, the ratio of a bit line current $I_{BIT}$ to reference current $I_{REF}$ may not be representative of the data stored. On the other hand, if both the bit line current $I_{BIT}$ and the reference current change $I_{REF}$ with temperature, then the ratio is believed to remain generally constant over a range of temperatures, and the output of the counter 90 is more likely to correlate with the data written to the data location 64. In other words, in the present embodiment, both the property being measured and the thing against which it is measured change with temperature, so overall, the effect of temperature should cancel out.

Figure 18:
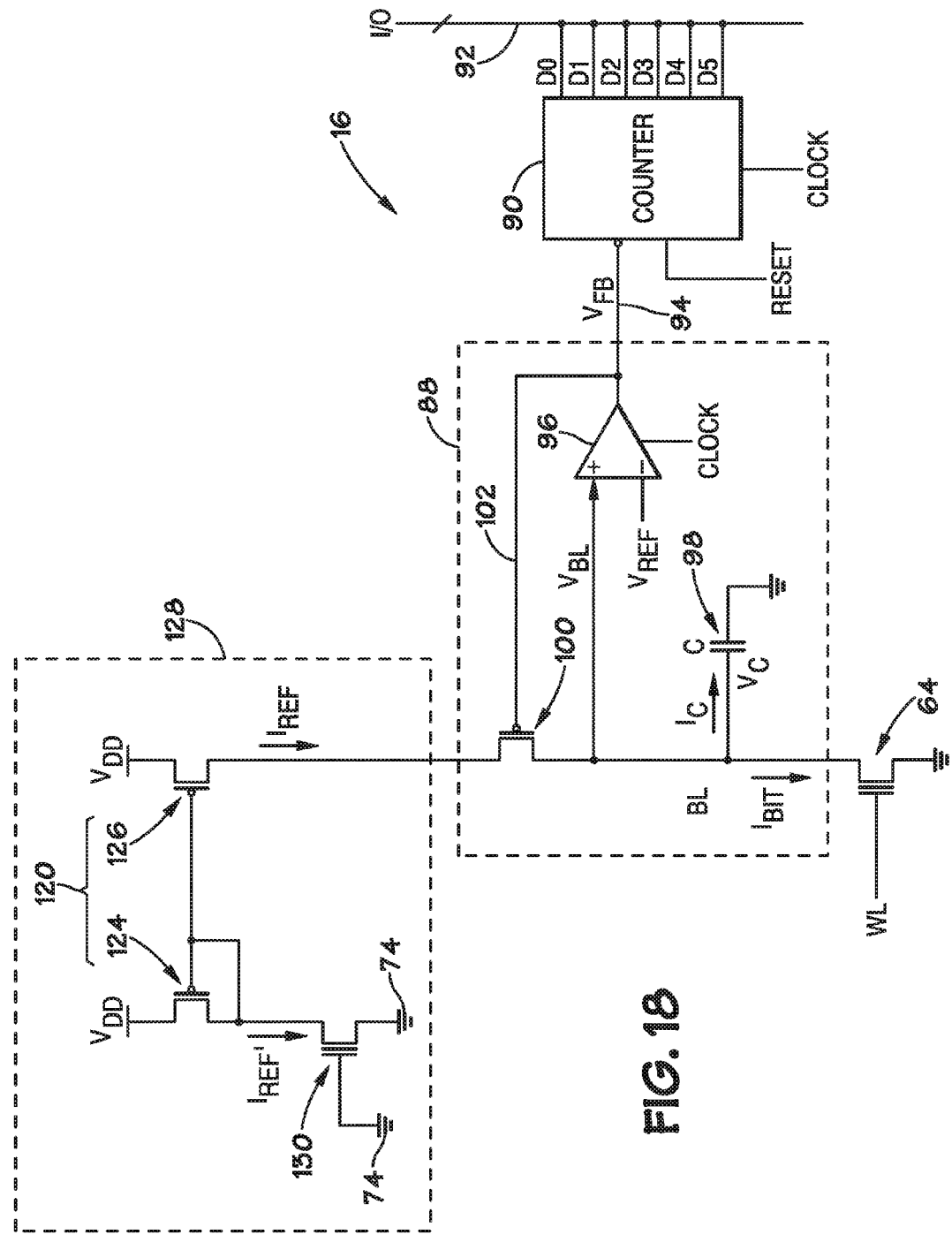
FIG. 18-21 illustrate additional examples of reference current sources in accordance with embodiments of the present invention.

FIG. 18 illustrates another embodiment of a reference current source 128. This reference current source 128 differs from the previously discussed reference current source 104 by including a floating gate transistor 130 as the data location 122. The illustrated floating gate transistor 130 is coupled to the current mirror 120 by its source and to ground 74 by its drain. In this embodiment, the control gate of the floating gate transistor 130 is also coupled to ground 74.

The floating gate transistor 130 may be configured to provide a desired reference current $I_{REF}$. As previously mentioned, in some embodiments, the reference current $I_{REF}$ is selected to be larger than the largest anticipated bit-line current $I_{BIT}$ to prevent the delta-sigma modulator 88 from saturating. To this end, in some embodiments, the floating gate transistor 130 may be programmed with no charge on its floating gate, a positive charge on its floating gate, or a negative charge on its floating gate, depending on the desired reference current $I_{REF}$. In some embodiments, other properties of the floating gate transistor 130 may be selected to produce a desired reference current $I_{REF}$. For example, the floating gate transistor 130 may have a wider channel than the floating gate transistor 64 that is being measured by the delta-sigma modulator 88.

Figure 19:
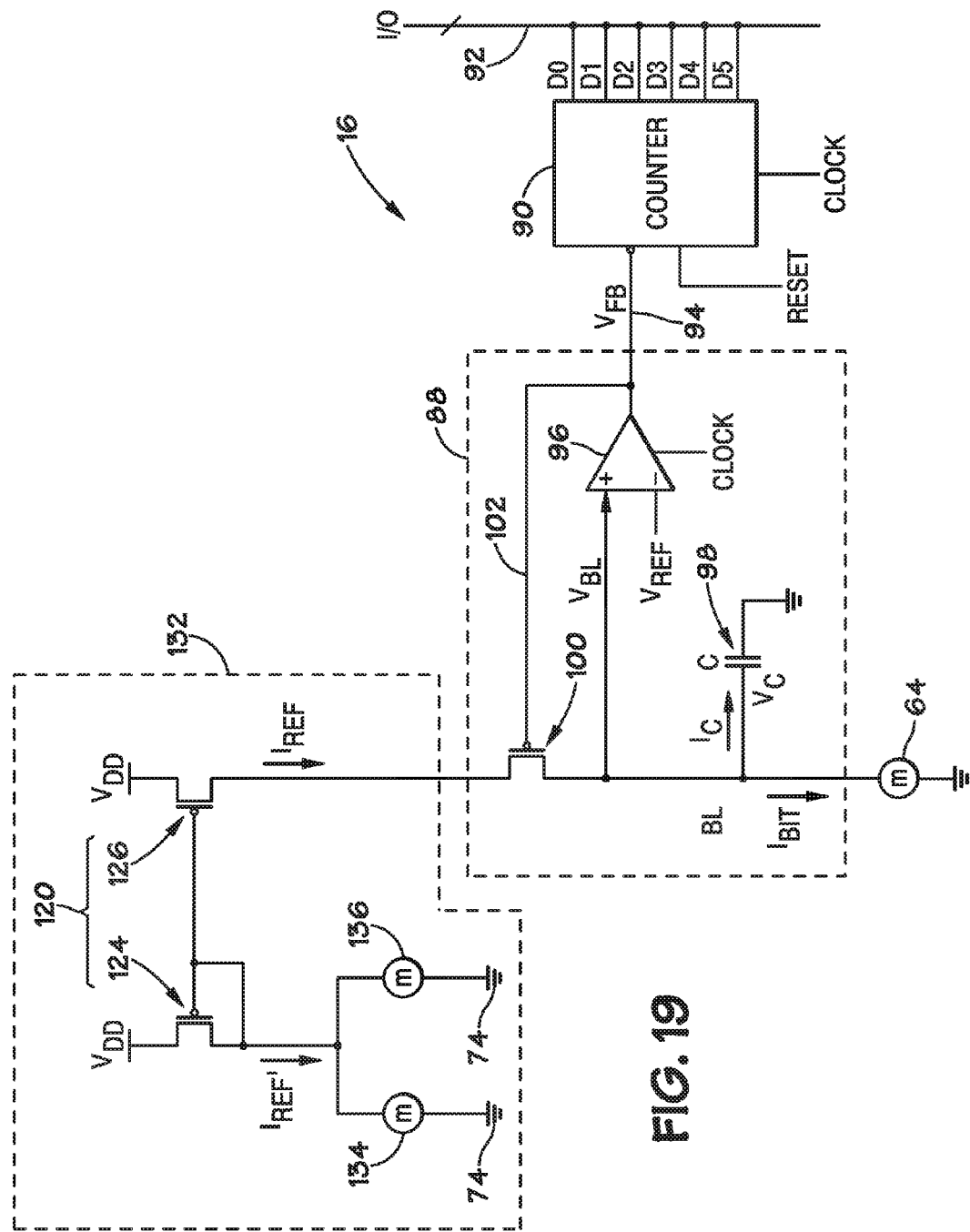

FIG. 19 illustrates a third embodiment of a reference current source 132. In this embodiment, the current mirror 120 is connected to ground 74 by two data locations 134 and 136 in parallel. As with the previously described embodiments, the data locations 134 and 136 may be the same type as the data location 64 that is being sensed. The parallel data locations 134 and 136 may produce a larger auxiliary reference current $I_{REF'}$ than a single data location. The larger current may, in turn, produce a larger reference current $I_{REF}$, which may tend to prevent the delta-sigma modulator 88 from saturating when the bit line current $I_{BIT}$ is particularly large. As a result, in some embodiments, the delta-sigma modulator 88 may sense a larger range of bit-line currents $I_{BIT}$, which may facilitate storing a larger range of values in the data location 64.

Along with temperature variations, other sources of noise may affect the operation of the quantizing circuit 16, among which are power supply noise and ground noise. These effects may arise when a large number of devices are simultaneously sinking or sourcing a current. The noise may affect the voltage drop across the data location 122 used to create the auxiliary reference current $I_{REF'}$. Consequently, in some embodiments, the reference current $I_{REF}$ applied when writing to the data location 64 may be different from the reference current $I_{REF}$ applied when reading from the data location 64. This difference could, in certain circumstances, cause the quantizing circuit 16 to read an erroneous value from the data location 64.

Figure 20:
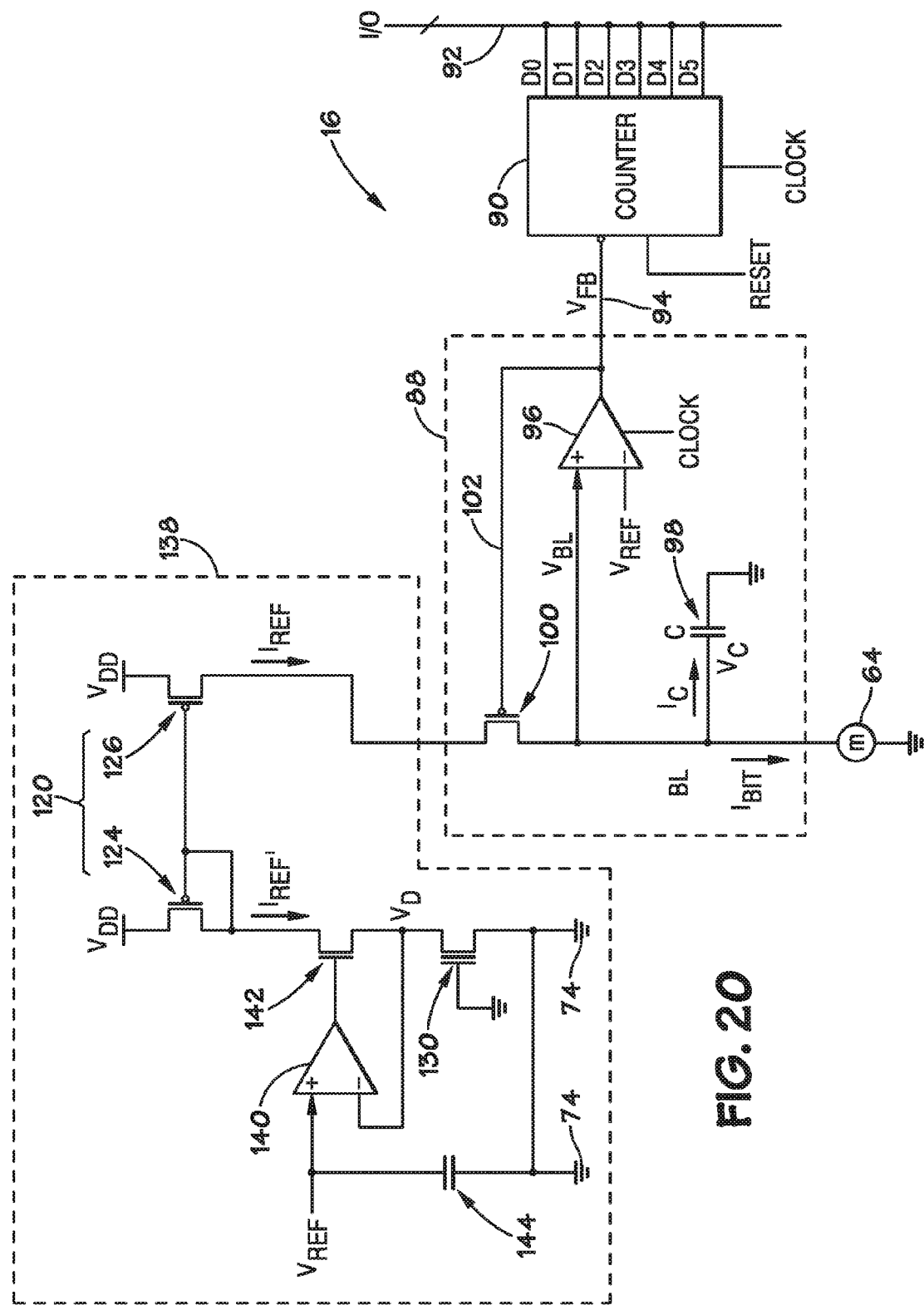

These sources of noise may be mitigated by the embodiment depicted by FIG. 20, which illustrates a fourth example of a reference current source 138. As described below, the reference current source 138 may exercise feedback control over the voltage drop across the floating gate transistor 130, thereby counteracting the effect of power supply noise and ground noise.

The illustrated reference current source 138 includes several components. In addition to the previously described current mirror 120 and floating gate transistor 130 (which functions as the reference device), the reference current source 138 may include a differential amplifier 140, a transistor 142, and a capacitor 144. The source and drain of the transistor 142 may be connected to the current mirror 120 and the floating gate transistor 130. The gate of the transistor 142 may be connected to the output of the differential amplifier 140. The non-inverting input of the differential amplifier 140 may be connected to both one plate of the capacitor 142 and a reference voltage $V_{REF}$, and the inverting input of the differential amplifier 140 may be connected to the drain of the floating gate transistor 130. The other plate of the capacitor 142 may be connected to ground 74.

In operation, the differential amplifier 140 may hold the drain voltage $V_D$ at a generally fixed potential. In the illustrated embodiment, the drain voltage $V_D$ remains generally equal to the reference voltage $V_{REF}$, even when the voltage of the power supply ($V_{DD}$) changes. For example, if the drain voltage $V_D$ drops below the reference voltage $V_{REF}$, the differential amplifier 140 may increase the gate voltage of the transistor 142, and additional charge may flow through the transistor 142 to elevate the drain voltage $V_D$ to the reference voltage $V_{REF}$. On the other hand, if the differential amplifier 140 senses that the drain voltage $V_D$ is greater than the reference voltage $V_{REF}$, then it may lower the voltage of the gate of the transistor 142 and decrease its source-to-drain resistance, which may decrease the drain voltage $V_D$. As a result, noise in the power supply may have little effect on the auxiliary reference current $I_{REF'}$, because the differential amplifier 140 may sense and counteract fluctuations in the power supply voltage $V_{DD}$.

This embodiment may also mitigate the effect of ground noise. The illustrated capacitor 144 AC-couples the non-inverting input of the differential amplifier 142 ground, so when the ground voltage changes, the change shifts the reference voltage $V_{REF}$. When the reference voltage $V_{REF}$ changes, the differential amplifier 140 may adjust the voltage of the gate of the transistor 142 to match the drain voltage $V_D$ to the new reference voltage $V_{REF}$. In this manner, the reference current source 138 counteracts changes in the ground voltage 74, thereby potentially reducing the effect of ground noise on the auxiliary reference current $I_{REF'}$.

The illustrated current source 138 is configured to mitigate three sources of noise: temperature fluctuations, power supply fluctuations, and ground voltage fluctuations. In other embodiments, the reference current source may be configured to mitigate a subset of these sources of noise or to mitigate additional sources of noise. For example, if the effect of ground noise is deemed acceptable, the reference current source 138 may not include the capacitor 142 or its connection to ground 74.

Figure 21:
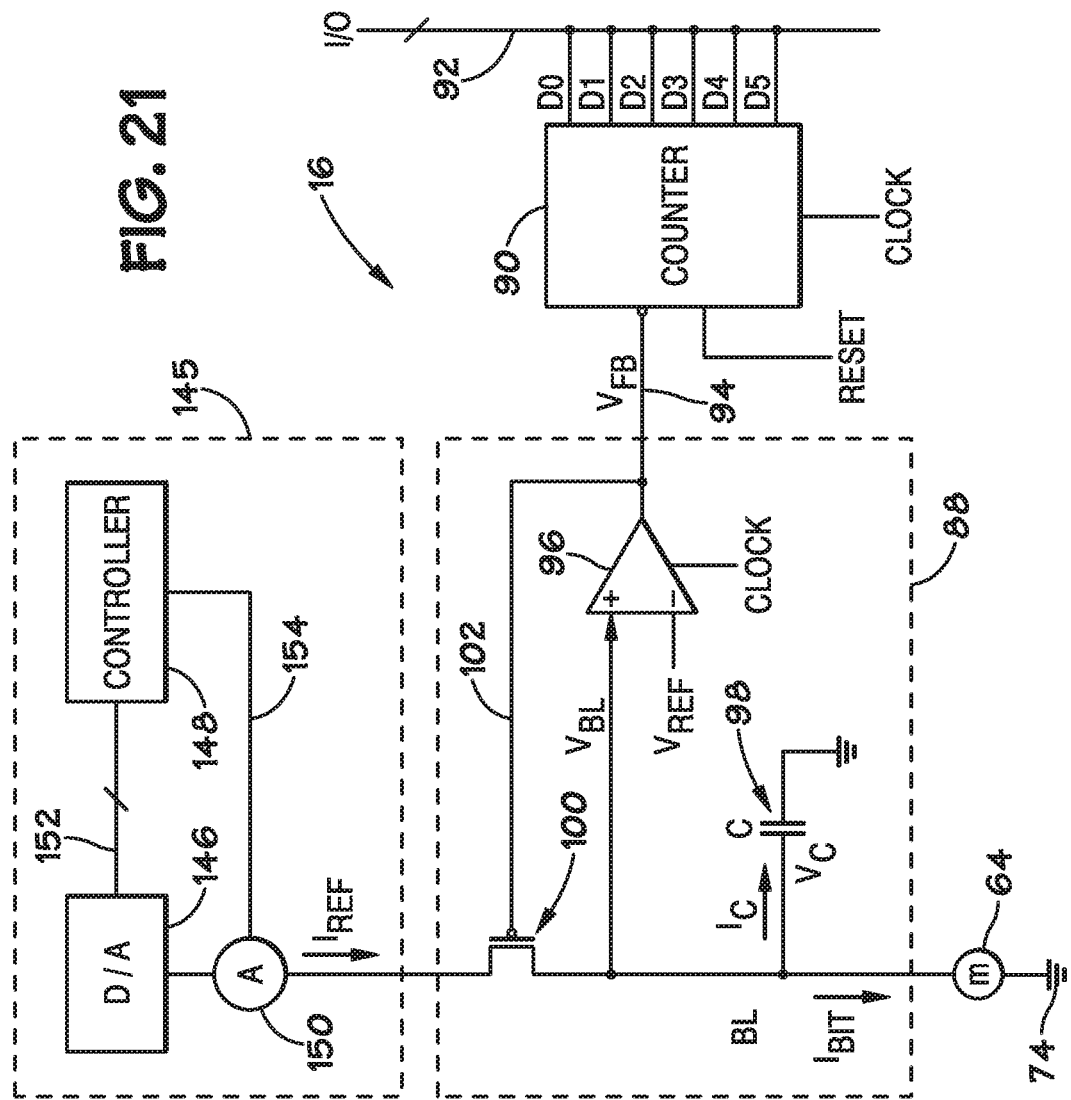

FIG. 21 illustrates another example of a reference current source 145. In this embodiment, the reference current source 145 includes a digital-to-analog converter 146, a controller 148, and an ammeter 150. The illustrated digital-to-analog converter 146 is connected to the controller 148 by a control bus 152, and the controller 148 is connected to the ammeter 150 by a sensor signal path 154. In this embodiment, the ammeter 150 is disposed on the bit line.

In operation, the reference current source 145 may exercise feedback control over the reference current $I_{REF}$. The ammeter 150 may sense the reference current $I_{REF}$ and send a signal indicative of the reference current to the controller 148 via the sensor signal path 154. The controller 148 may receive the signal and compare it to a predetermined target reference current. Based on this comparison, the controller 148 may send a control signal on the control bus 152 to the digital-to-analog converter 146. The control signal may cause the digital-to-analog converter 146 to increase, maintain, or decrease the reference current $I_{REF}$ to match the reference current $I_{REF}$ to the target reference current. Thus, in this embodiment, the reference current source 145 may exercise feedback control over the reference current $I_{REF}$. Advantageously, this control may reduce the effect of a variety of sources of noise, such as those discussed above.

Figure 22:
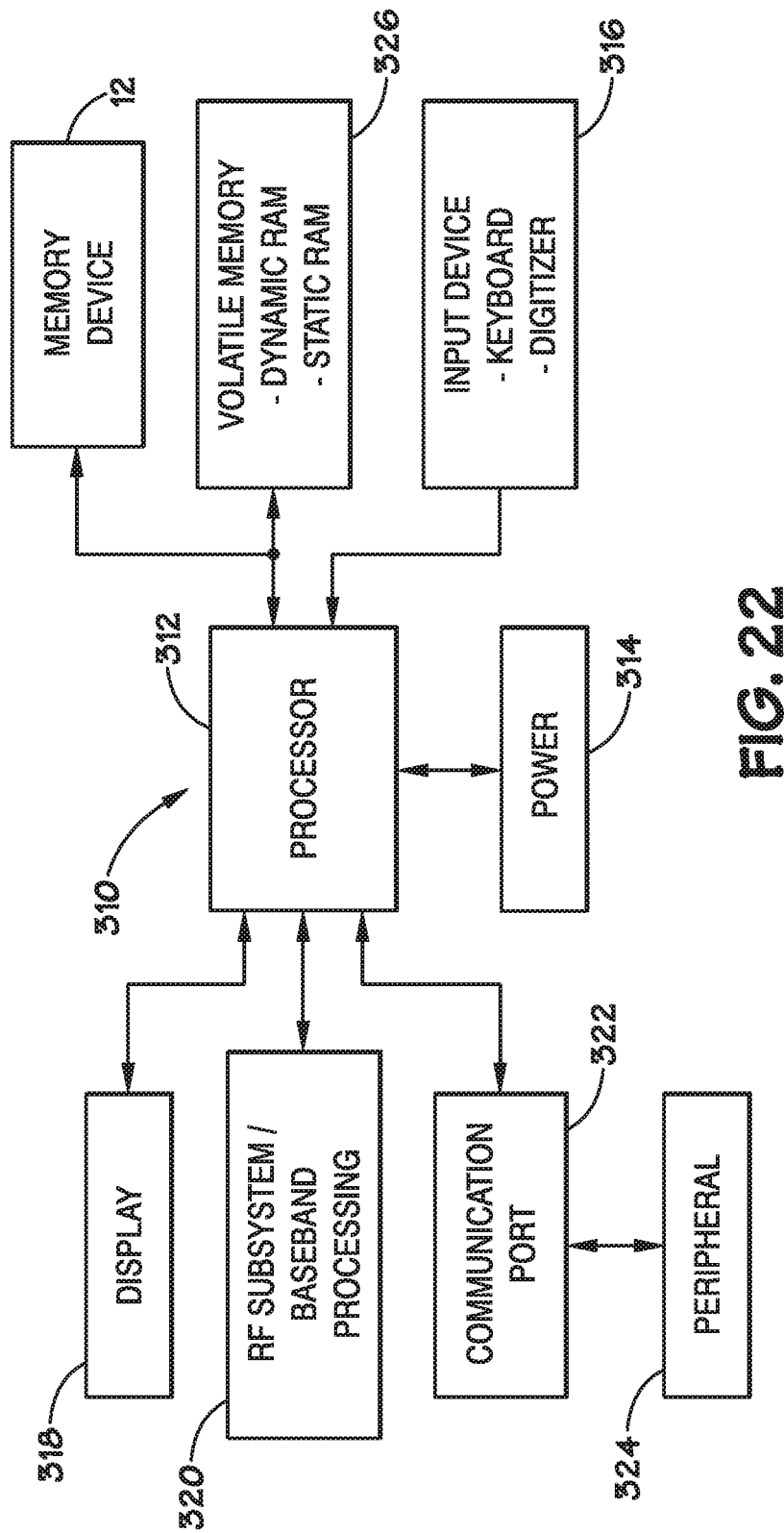
FIG. 22 illustrates an example of a system that includes the electronic device of FIG. 2.

FIG. 22 depicts an exemplary processor-based system 310 that includes the memory device 12. Alternatively or additionally, the system 310 may include the imaging device 13. The system 310 may be any of a variety of types such as a computer, pager, cellular phone, personal organizer, control circuit, etc. In a typical processor-based system, one or more processors 312, such as a microprocessor, control the processing of system functions and requests in the system 310. The processor 312 and other subcomponents of the system 310 may include quantizing circuits, such as those discussed above.

The system 310 typically includes a power supply 314. For instance, if the system 310 is a portable system, the power supply 314 may advantageously include a fuel cell, permanent batteries, replaceable batteries, and/or rechargeable batteries. The power supply 314 may also include an AC adapter, so the system 310 may be plugged into a wall outlet, for instance. The power supply 314 may also include a DC adapter such that the system 310 may be plugged into a vehicle cigarette lighter, for instance.

Various other devices may be coupled to the processor 312 depending on the functions that the system 310 performs. For instance, a user interface 316 may be coupled to the processor 312. The user interface 316 may include buttons, switches, a keyboard, a light pen, a mouse, a digitizer and stylus, and/or a voice recognition system, for instance. A display 318 may also be coupled to the processor 312. The display 318 may include an LCD, an SED display, a CRT display, a DLP display, a plasma display, an OLED display, LEDs, and/or an audio display, for example. Furthermore, an RF sub-system/baseband processor 320 may also be coupled to the processor 312. The RF sub-system/baseband processor 320 may include an antenna that is coupled to an RF receiver and to an RF transmitter (not shown). One or more communication ports 322 may also be coupled to the processor 312. The communication port 322 may be adapted to be coupled to one or more peripheral devices 324 such as a modem, a printer, a computer, or to a network, such as a local area network, remote area network, intranet, or the Internet, for instance.

The processor 312 generally controls the system 310 by implementing software programs stored in the memory. The memory is operably coupled to the processor 312 to store and facilitate execution of various programs. For instance, the processor 312 may be coupled to the volatile memory 326 which may include Dynamic Random Access Memory (DRAM) and/or Static Random Access Memory (SRAM). The volatile memory 326 is typically large so that it can store dynamically loaded applications and data. As described further below, the volatile memory 326 may be configured in accordance with embodiments of the present invention.

The processor 312 may also be coupled to the memory device 12. The memory device 12 may include a read-only memory (ROM), such as an EPROM, and/or flash memory to be used in conjunction with the volatile memory 326. The size of the ROM is typically selected to be just large enough to store any necessary operating system, application programs, and fixed data. Additionally, the non-volatile memory 328 may include a high capacity memory such as a tape or disk drive memory.

The memory device 10 and volatile memory 326 may store various types of software, such as an operating system or office productivity suite including a word processing application, a spreadsheet application, an email application, and/or a database application.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A system, comprising:
 an electronic device comprising:
  a data location of an array of data locations;
  a delta-sigma modulator coupled to the data location; and
  a reference current source comprising a reference device, wherein the reference current source is configured to compensate for an effect of temperature changes of the data location, wherein the reference current source is configured to supply a reference current, to the delta-sigma modulator and the reference device, for use in determining a data value stored in the data location.

2. The system of claim 1, wherein the reference current source comprises:
 a current mirror with a first side coupled to the delta-sigma modulator; and
 a floating gate transistor coupled to a second side of the current mirror.

3. The system of claim 2, wherein the reference current source comprises parallel floating gate transistors.

4. The system of claim 2, wherein the reference current source comprises a differential amplifier configured to exercise feedback control of a terminal of the floating gate transistor.

5. The system of claim 1, wherein the reference current source comprises a digital-to-analog converter configured to provide the reference current to the delta-sigma modulator.

6. The system of claim 1, comprising:
 a system board coupled to the electronic device; and
 a processor coupled to the electronic device via the system board.

7. The system of claim 1, wherein the electronic device comprises a memory device.

8. The system of claim 7, wherein the data location comprises a memory element.

9. The system of claim 1, wherein the data location comprises an imaging element.

10. A system, comprising:
 an electronic device comprising:
  a data location;
  a sensing circuit configured to sense a voltage or current from the data location based upon a comparison of a fixed reference voltage with a bit line voltage generated from the data location; and
  a reference current source comprising a reference device, wherein the reference current source is configured to provide a reference current to the sensing circuit and the reference device.

11. The system of claim 10, wherein the reference current source is configured to track a temperature response of the data location and compensate for the temperature response.

12. The system of claim 10, wherein the reference current source is configured to counteract a temperature induced variation in the data location.

13. The system of claim 10, wherein the reference device is substantially the same type of device as the data location.

14. The system of claim 10, wherein the data location comprises a floating gate transistor.

15. The system of claim 10, wherein the sensing circuit comprises a delta-sigma modulator.

16. The system of claim 10, wherein the reference current source comprises a current mirror.

17. A system, comprising:
 an electronic device comprising:
  a data location;
  a sensing circuit configured to sense a voltage or current from the data location based upon a comparison of a fixed reference voltage with a bit line voltage generated from the data location; and
  a reference current source comprising a reference device and a current mirror, wherein the reference current source is configured to provide a reference current to the sensing circuit and the reference device.

18. The system of claim 17, wherein the reference current source is configured to track a temperature response of the data location and compensate for the temperature response.

19. The system of claim 17, wherein the reference current source is configured to counteract a temperature induced variation in the data location.

20. The system of claim 17, wherein the reference device comprises a same type of device as the data location.

21. The system of claim 17, wherein the reference current source is configured to supply the reference current to the sensing circuit for use in determining a data value stored in the data location.

22. The system of claim 17, wherein the reference device comprises two reference devices arranged in parallel.

23. The system of claim 17, wherein the reference current source comprises:
 a differential amplifier having an output, an input coupled to the reference device, and another input coupled to the fixed reference voltage; and
 a transistor having one terminal connected to the current mirror, another terminal connected to the reference device, and a gate coupled to the output of the differential amplifier.

* * * * *